(12) United States Patent
Sasaki et al.

(10) Patent No.: US 7,790,586 B2
(45) Date of Patent: Sep. 7, 2010

(54) PLASMA DOPING METHOD

(75) Inventors: Yuichiro Sasaki, Osaka (JP); Katsumi Okashita, Osaka (JP); Hiroyuki Ito, Chiba (JP); Bunji Mizuno, Nara (JP)

(73) Assignee: Panasonic Corporation, Osaka (JP)

( * ) Notice: Subject to any disclaimer, the term of this patent is extended or adjusted under 35 U.S.C. 154(b) by 156 days.

(21) Appl. No.: 12/158,852

(22) PCT Filed: Nov. 13, 2007

(86) PCT No.: PCT/JP2007/071996

§ 371 (c)(1),
(2), (4) Date: Jun. 23, 2008

(87) PCT Pub. No.: WO2008/059827

PCT Pub. Date: May 22, 2008

(65) Prior Publication Data

US 2009/0233427 A1   Sep. 17, 2009

(30) Foreign Application Priority Data

Nov. 15, 2006   (JP) .............................. 2006-309427

(51) Int. Cl.
*H01L 21/26* (2006.01)
*H01L 21/265* (2006.01)
*H01L 21/425* (2006.01)
(52) U.S. Cl. ........................ 438/513; 438/521; 438/529
(58) Field of Classification Search ........................ None
See application file for complete search history.

(56) References Cited

U.S. PATENT DOCUMENTS

| 4,912,065 | A | 3/1990 | Mizuno et al. |
| 5,218,179 | A | 6/1993 | Matossian et al. |
| 5,296,272 | A | 3/1994 | Matossian et al. |
| 2005/0170669 | A1 | 8/2005 | Okumura et al. |
| 2005/0287776 | A1* | 12/2005 | Sasaki et al. ................ 438/510 |
| 2007/0020958 | A1 | 1/2007 | Okumura et al. |

(Continued)

FOREIGN PATENT DOCUMENTS

JP            4-264346            9/1992

(Continued)

OTHER PUBLICATIONS

International Technology Roadmap for Semiconductors 2001 Edition (ITRS 2001) (Particularly, Shallow Junction Ion Doping in Figure 30 of Front End Process).

(Continued)

*Primary Examiner*—Scott B Geyer
(74) *Attorney, Agent, or Firm*—McDermott Will & Emery LLP

(57) ABSTRACT

An impurity region is formed in a surface of a substrate by exposing the substrate to a plasma generated from a gas containing an impurity in a vacuum chamber. In this process, a plasma doping condition is set with respect to a dose of the impurity to be introduced into the substrate so that a first one of doses in a central portion and in a peripheral portion of the substrate is greater than a second one of the doses during an initial period of doping, with the second dose becoming greater than the first dose thereafter.

22 Claims, 11 Drawing Sheets

U.S. PATENT DOCUMENTS

| | | |
|---|---|---|
| 2007/0166846 A1 | 7/2007 | Sasaki et al. |
| 2007/0190759 A1 | 8/2007 | Sasaki et al. |
| 2007/0212837 A1* | 9/2007 | Mizuno et al. .............. 438/275 |
| 2008/0200015 A1* | 8/2008 | Miller et al. ................ 438/510 |
| 2009/0004836 A1* | 1/2009 | Singh et al. ................ 438/513 |

FOREIGN PATENT DOCUMENTS

| | | |
|---|---|---|
| JP | 2001-156013 | 6/2001 |
| JP | 2004-179592 | 6/2004 |
| JP | 2005-109453 | 4/2005 |
| WO | WO 2006/064772 A1 | 6/2006 |
| WO | WO 2006/106872 A1 | 10/2006 |

OTHER PUBLICATIONS

International Technology Roadmap for Semiconductors 2003 Edition (ITRS 2003).

Sasaki, Y., et al., "$B_2H_6$ Plasma Doping with In-situ He Pre-amorphization", Symp. on VLSI Tech., 2004, p. 180.

* cited by examiner

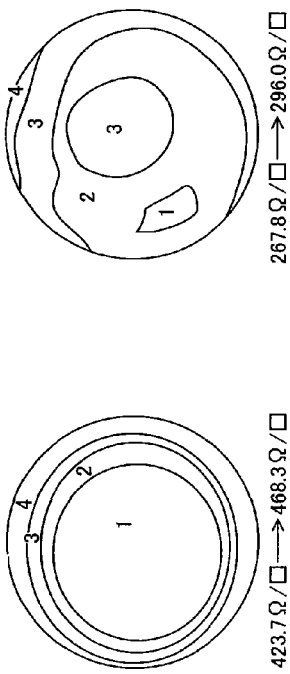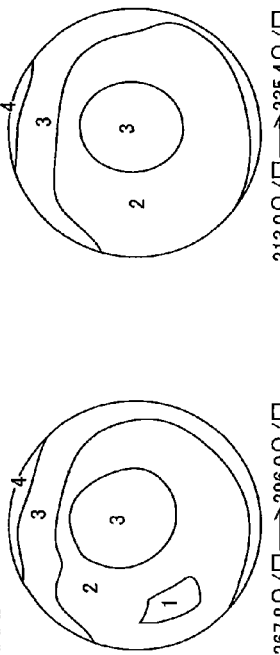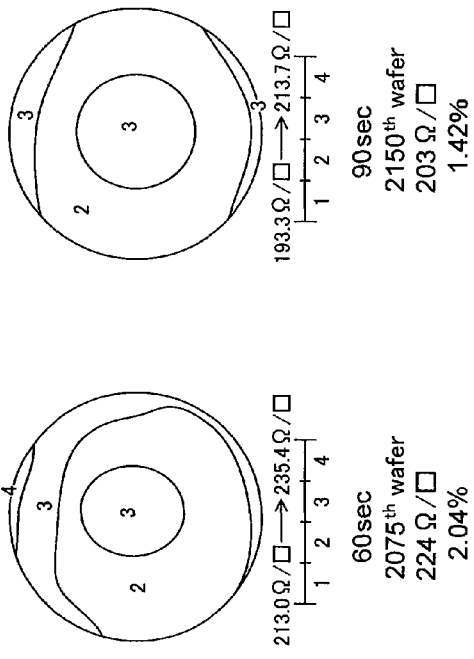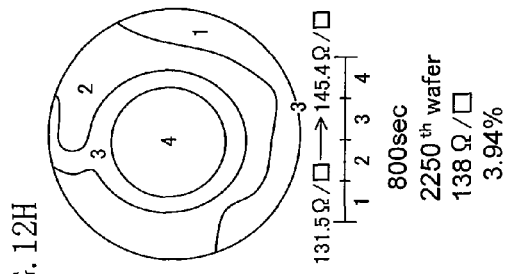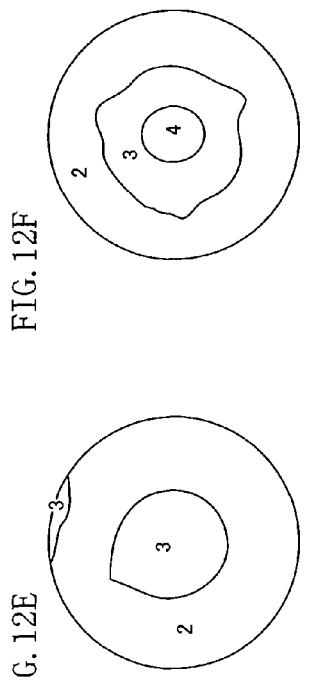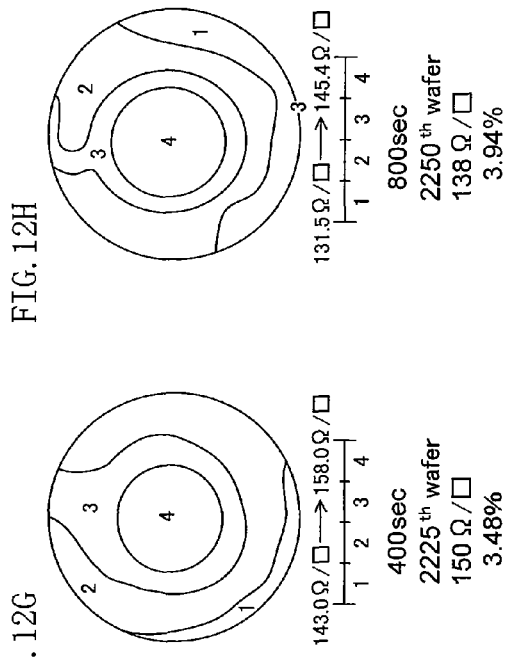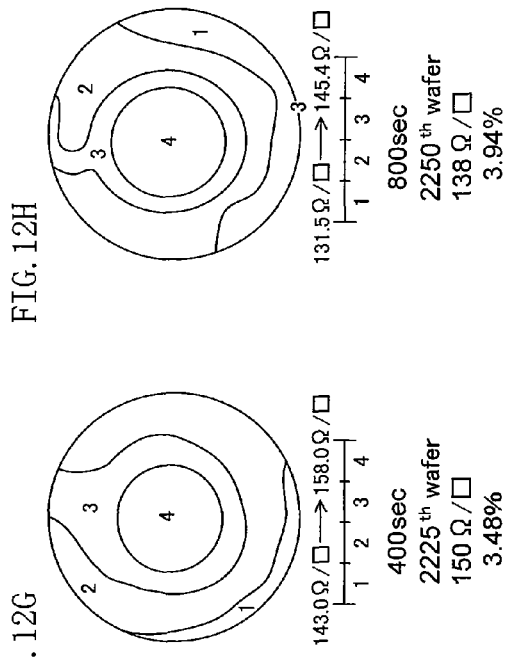

FIG. 16

| | A | B | C | D | E | F | G | H |
|---|---|---|---|---|---|---|---|---|
| PD time | 5sec | 20sec | 60sec | 90sec | 120sec | 200sec | 400sec | 800sec |
| Sheet resistance | 446Ω/□ | 282Ω/□ | 224Ω/□ | 203Ω/□ | 188Ω/□ | 165Ω/□ | 150Ω/□ | 138Ω/□ |
| 1σ | 7.08% | 2.63% | 2.04% | 1.42% | 1.36% | 2.05% | 3.48% | 3.94% |

US 7,790,586 B2

PLASMA DOPING METHOD

RELATED APPLICATIONS

This application is the U.S. National Phase under 35 U.S.C. §371 of International Application No. PCT/JP2007/071996, filed on Nov. 13, 2007, which in turn claims the benefit of Japanese Patent Application No. 2006-309427, filed on Nov. 15, 2006, the disclosures of which Applications are incorporated by reference herein.

TECHNICAL FIELD

The present invention relates to a plasma doping method, and more particularly to a plasma doping method for introducing an impurity into the surface of a solid material such as a semiconductor substrate.

BACKGROUND ART

Known techniques for introducing an impurity into the surface of a solid material include a plasma doping (PD) method of introducing an impurity into the solid material with a low energy after ionizing the impurity (see, for example, Patent Document 1).

The ion implantation method is currently the most widespread method for introducing an impurity. The plasma doping method is mentioned as an item in Non-Patent Document 1, and is stated in Non-Patent Document 2 as being an impurity-introducing technique of the next generation which should replace the ion implantation method.

Ion implantation employs an apparatus configuration including an ion source for generating a plasma from a gas, an analyzing magnet for mass separation to select ions of interest from among ions extracted from the ion source, an electrode for accelerating the ions of interest, and a process chamber for implanting the accelerated ions of interest into a silicon substrate. With ion implantation, the impurity can be implanted to a shallow depth by using a small energy and a small acceleration energy for extracting ions from the ion source. However, a decrease in the extraction energy reduces the number of ions to be extracted. Moreover, if the acceleration energy is decreased, the diameter of the ion beam being delivered from the ion source onto the wafer is widened by the repulsive force acting between ions due to their electric charge, whereby the beam line hits the inner wall of the chamber, thus losing a large number of ions and thereby lowering the implantation throughput. In a case where $B^+$ ions are implanted, for example, the throughput starts to decrease when the acceleration energy is 2 keV or less, and the delivery of the beam itself becomes difficult when the acceleration energy is 0.5 keV or less. Moreover, even when the energy is lowered down to 0.5 keV, B is implanted to a depth of as much as about 20 nm. Thus, if one attempts to form an extension region thinner than this, the productivity will be very low.

In contrast, the plasma doping method employs an apparatus configuration including a cylindrical vacuum chamber capable of accommodating a silicon substrate therein, a plasma generation source for inducing a plasma, a bias electrode on which the silicon substrate is mounted, and a bias power source for adjusting the potential of the bias electrode. Thus, the plasma doping method employs an apparatus configuration that is totally different from that of ion implantation, in which neither the analyzing magnet nor the acceleration electrode is provided. Specifically, a bias electrode serving also as a wafer holder is provided in a vacuum chamber, and ions in the plasma are accelerated and introduced into the wafer by the potential generated between the plasma and the wafer. Thus, an impurity can be introduced by directly using a low-energy plasma, whereby the wafer can be irradiated with a large amount of low-energy ions as compared with ion implantation. Specifically, the dose rate in plasma doping is an order or orders of magnitude greater than that of ion implantation, and it is possible with this characteristic to maintain a high throughput even with low energy B implantation.

In addition, the present inventors have developed a process technique for forming an extension region that is very shallow and has a low resistance, based on the plasma doping method (Non-Patent Document 3).

Moreover, the present inventors have proposed a method with which it is possible to stably generate and sustain a plasma and to easily control the amount of dopant implantation, while enhancing the level of safety by diluting $B_2H_6$, which is toxic and highly hazardous to humans, as much as possible and without decreasing the doping efficiency (Patent Document 2). With this method, the $B_2H_6$ gas as a substance containing the dopant impurity is diluted with an He gas having a low ionization energy, and the He plasma is generated in advance, after which $B_2H_6$ is discharged. Moreover, the present inventors have also proposed that the concentration of the $B_2H_6$ gas in this method is preferably less than 0.05% by mass.

Furthermore, the present inventors have proposed a plasma doping method in which the doping time and the concentration of the gas containing an impurity are set so that the dose is constant without time dependency to enhance the dose control precision (Patent Document 3). Specifically, the present inventors have discovered that when a bias is applied while the silicon substrate is irradiated with a $B_2H_6$/He plasma, for example, there is a time period over which the dose of boron is substantially constant, and Patent Document 3 discloses a method for controlling the dose by using the time period, over which the dose stays substantially constant over time, as the process window.

Patent Document 1: U.S. Pat. No. 4,912,065
Patent Document 2: Japanese Laid-Open Patent Publication No. 2004-179592
Patent Document 3: WO06/064772
Non-Patent Document 1: International Technology Roadmap for Semiconductors 2001 Edition (ITRS 2001) (Particularly, Shallow Junction Ion Doping in FIG. 30 of Front End Process)
Non-Patent Document 2: International Technology Roadmap for Semiconductors 2003 Edition (ITRS 2003)
Non-Patent Document 3: Y. Sasaki, et al., $B_2H_6$ Plasma Doping with "In-situ He Pre-amorphization", Symp. on VLSI Tech., 2004, p. 180

DISCLOSURE OF THE INVENTION

Problems to be Solved by the Invention

As described above, for the formation of an impurity-introduced region, the dose control is a very important issue. Particularly, the dose uniformity across the substrate surface is a very important issue for device formation.

Moreover, the wafer diameter has been increasing in recent years, and wafer diameters of 300 mm or more have been proposed in the art to replace the 200 mm wafer diameter. With such large-diameter wafers, there is a serious problem that a sufficient level of dose uniformity across the surface may not be obtained even by means of plasma doping.

In view of the above, it is an object of the present invention to provide a plasma doping method capable of controlling the dose with a high precision, and more particularly a plasma doping method capable of controlling with a high precision the dose uniformity across the substrate surface.

Means for Solving the Problems

In order to achieve the object set forth above, a plasma doping method of the present invention is a plasma doping method for forming an impurity region in a surface of a substrate by exposing the substrate to a plasma generated from a gas containing an impurity in a vacuum chamber, wherein the substrate is plasma-doped with the impurity under a plasma doping condition set with respect to a dose of the impurity to be introduced into the substrate so that a first one of doses in a central portion and in a peripheral portion of the substrate is greater than a second one of the doses during an initial period of doping, with the second dose becoming greater than the first dose thereafter.

As a result of various experiments, the present inventors have found the following. Where one employs a plasma doping condition with respect to the distribution of the dose across the substrate (wafer) surface such that the dose in the wafer central portion is greater than that in the wafer peripheral portion during an initial period of doping, and changes the plasma doping condition thereafter so that the rate of increase in the dose in the wafer peripheral portion becomes higher than that in the wafer central portion over time, there exists a point in time at which the shape (gradient) of the dose distribution curve is reversed, and in the vicinity of the time of reversal, the dose is substantially uniform across the substrate surface and the rate of change in the dose is small over a relatively long period of time.

Specifically, based on the finding that the dose distribution across the substrate surface is uniform and the rate of change in the dose is small in the vicinity of the point in time at which the gradient of the distribution is reversed, the present invention sets, as the end point of the plasma doping time, the vicinity of the point in time at which the gradient of the dose distribution across the substrate surface is reversed.

For example, in the plasma doping method of the present invention, the substrate may be plasma-doped with the impurity under the plasma doping condition set with respect to a dose of the impurity to be introduced into the substrate so that a dose in a central portion of the substrate is greater than a dose in a peripheral portion of the substrate during the initial period of doping, with the dose in the peripheral portion of the substrate becoming greater than the dose in the central portion of the substrate thereafter.

Specifically, another characteristic of the plasma doping method of the present invention is that an extent of time over which the doses in the central portion and in the peripheral portion of the substrate are substantially equal to each other under the set plasma doping condition is pre-detected before the substrate is plasma-doped with the impurity, and the substrate is plasma-doped with the impurity by using a predetermined plasma doping time that is included within the extent of time.

With such a configuration, plasma doping with a desirable level of dose uniformity across the substrate surface can be realized stably and reproducibly.

In the plasma doping method of the present invention, the plasma doping condition may be set so that a distribution of the impurity dose across a principal plane of the substrate is in rotational symmetry with respect to a center of the substrate during the initial period of doping. With such a configuration, it is possible to realize a more uniform dose distribution across the wafer surface.

In the plasma doping method of the present invention, the plasma doping condition may be set so that a distribution of the impurity dose across a principal plane of the substrate has a gradient along at least one diameter passing through a center of the substrate during the initial period of doping. With such a configuration, it is possible to realize a more uniform dose distribution across the wafer surface.

In the plasma doping method of the present invention, the plasma doping condition may be changed while the substrate is plasma-doped with the impurity. In such a case, the changed plasma doping condition may be set so that an amount of change per unit time of the dose in the central portion of the substrate and that in the peripheral portion of the substrate are different from each other.

In a case where the plasma doping condition is changed while the substrate is plasma-doped with the impurity, the plasma doping condition during the initial period of doping may be set so that a distribution of a flow rate of the gas is such that the flow rate is greater on the central portion of the substrate than on the peripheral portion of the substrate; and the changed plasma doping condition may be set so that the distribution of the flow rate of the gas is such that the flow rate is smaller on the central portion of the substrate than on the peripheral portion of the substrate.

As a result of conducting various experiments, the present inventors have found the following. Where plasma doping is performed by applying a bias while irradiating a silicon substrate with a plasma generated from a $B_2H_6$/He gas, for example, if one employs a plasma doping condition set so that the distribution of the flow rate of the $B_2H_6$/He gas is such that the flow rate is greater on the substrate central portion than on the substrate peripheral portion during the initial period of doping, and changes the plasma doping condition thereafter so that the distribution of the flow rate of the $B_2H_6$/He gas is such that the flow rate is smaller on the substrate central portion than on the substrate peripheral portion, the dose of boron becomes substantially uniform across the surface of the silicon substrate at the above-described point in time at which the gradient of the dose distribution across the substrate surface is reversed.

Specifically, if one employs a condition set so that the dose in the substrate peripheral portion is greater than that in the substrate central portion during the initial period of plasma doping, and changes the condition thereafter so that the amount of increase of dose per unit time is smaller in the substrate central portion than in the substrate peripheral portion, there exists a point in time at which the dose profile (the shape of distribution across the substrate surface) is reversed. Therefore, it is possible to control, with a high precision, the dose uniformity across the substrate surface by using a predetermined extent of time including the point in time as the process window of plasma doping time.

With such a configuration, if the plasma doping time is set within a predetermined extent of time including the point in time at which the dose profile is reversed, the dose integrated over the plasma doping time is substantially unvaried among different points across the substrate surface even if the time is slightly varied, whereby it is possible to stably perform plasma doping with a high level of dose uniformity across the substrate surface.

As described above, if one employs a condition set so that the dose in the substrate central portion is greater than that in the substrate peripheral portion during the initial period of plasma doping, and changes the condition thereafter so that the amount of increase of dose per unit time is smaller in the substrate central portion than in the substrate peripheral portion, it is possible to obtain a dose distribution with a high level of uniformity across the substrate surface.

With the plasma doping method of the present invention, in a case where the plasma doping condition is changed while the substrate is plasma-doped with the impurity, the plasma doping condition during the initial period of doping may be set so that a distribution of a concentration of the gas is such that the concentration is greater on the central portion of the substrate than on the peripheral portion of the substrate; and the changed plasma doping condition may be set so that the distribution of the concentration of the gas is such that the concentration is smaller on the central portion of the substrate than on the peripheral portion of the substrate, so as to obtain similar effects. Alternatively, the plasma doping condition during the initial period of doping may be set so that a distribution of a source power for generating the plasma is such that the source power is smaller on the central portion of the substrate than on the peripheral portion of the substrate; and the changed plasma doping condition may be set so that the source power distribution is such that the source power is greater on the central portion of the substrate than on the peripheral portion of the substrate. Alternatively, the plasma doping condition during the initial period of doping may be set so that a temperature distribution across the substrate is such that the temperature is lower in the peripheral portion of the substrate and higher in the central portion of the substrate; and the changed plasma doping condition may be set so that the temperature distribution across the substrate is such that the temperature is higher in the peripheral portion of the substrate and lower in the central portion of the substrate.

As a plasma doping process is performed by using $B_2H_6$ as a doping material gas, for example, a boron-containing film (boron film) deposits on the inner wall of the vacuum chamber. It is believed that as the thickness of the boron film deposit increases, the probability for boron radicals to be adsorbed onto the inner wall of the vacuum chamber decreases, thereby increasing the boron radical concentration in the plasma.

As the area of the vacuum chamber inner wall over which the boron film is formed increases, there is a gradual increase in the amount of particles including boron to be supplied into the plasma through sputtering as ions in the plasma are accelerated by the potential difference between the plasma and the vacuum chamber inner wall to impinge upon the boron film deposited on the inner wall of the vacuum chamber. Therefore, over the course of the plasma doping process, the dose gradually increases as more substrates are processed even with the same condition. The degree of increase is very large, and the dose to be introduced into the subject substrate by the plasma doping process immediately after washing the inner wall of the vacuum chamber with water and an organic solvent is only about 8% to 30% of the dose to be introduced into the subject substrate by the plasma doping process after the plasma doping process is repeated on hundreds of subject substrates. Thereafter, when the plasma doping process is further repeated on more subject substrates, and the area of the vacuum chamber inner wall over which the boron film is formed becomes greater than a certain size, the area over which the boron film is formed will be unlikely to increase. At this stage, there will be only a small rate of increase in the dose as more substrates are subjected to the plasma doping process.

Thus, in a plasma doping process after the plasma doping process is repeated on hundreds of substrates since the inner wall of the vacuum chamber is washed with water and an organic solvent, the dose of boron due to particles including boron supplied into the plasma through sputtering as ions in the plasma impinge upon the boron film deposited on the inner wall of the vacuum chamber is dominant with respect to the total dose. In a plasma doping process on one substrate, the amount of boron supplied into the plasma through sputtering from the boron film is small during an initial period of doping (the process time of up to about five seconds), and increases as the process time increases (about 20 seconds). It is believed that this is because the temperature of the vacuum chamber inner wall increases due to heating by the plasma as the process time increases, whereby boron is more easily sputtered from the boron film after some process time than during the initial period of doping. Moreover, boron supplied from the boron film into the plasma is more easily doped into the wafer peripheral portion as compared with the wafer central portion. This is because the distance from the wafer peripheral portion to the boron film on the vacuum chamber inner wall is shorter than the distance from the wafer central portion to the boron film on the vacuum chamber inner wall. Therefore, a comparison between the dose in the wafer peripheral portion and that in the wafer central portion shows that in a case where the amount of boron to be doped from within the plasma into the substrate is uniform across the substrate surface, excluding boron from the boron film, the dose in the wafer central portion and that in the wafer peripheral portion are about the same during the initial period of doping, but the dose in the wafer peripheral portion is greater than that in the wafer central portion after some process time.

As described above, as a result of conducting various experiments, the present inventors have found the following. As the doping process time increases, the dose in the wafer peripheral portion tends to increase due to particles including boron being supplied from the inner wall of the vacuum chamber into the plasma, which accounts for one reason why dose uniformity across the substrate surface is not obtained.

Based on this finding, the present inventors have arrived at the invention as follows. In a case where a boron film is formed on the inner wall of the vacuum chamber, if one employs a condition set so that the dose in the wafer central portion is greater than that in the wafer peripheral portion during an initial period of doping, there will later be a point in time at which the dose profile is reversed due to particles including boron being supplied from the inner wall of the vacuum chamber into the plasma. Therefore, it is possible to form an impurity region having a high level of dose uniformity across the substrate surface by using a predetermined extent of time including the point in time as the process window of plasma doping time.

Specifically, in the plasma doping method of the present invention, a film containing the impurity may be already formed on an inner wall of the vacuum chamber before the substrate is plasma-doped with the impurity; and the plasma doping condition may be set so that a distribution of a flow rate of the gas is such that the flow rate on the peripheral portion of the substrate is equal to that on the central portion of the substrate. Alternatively, a film containing the impurity may be already formed on an inner wall of the vacuum chamber before the substrate is plasma-doped with the impurity; and the plasma doping condition may be set so that the distribution of the concentration of the gas is such that the concentration on the peripheral portion of the substrate is equal to that on the central portion of the substrate. Alternatively, a film containing the impurity may be already formed on an inner wall of the vacuum chamber before the substrate is plasma-doped with the impurity; and the plasma doping condition may be set so that a distribution of a source power for generating the plasma is such that the source power on the peripheral portion of the substrate is equal to that on the central portion of the substrate. Alternatively, a film containing the impurity may be already formed on an inner wall of the vacuum chamber before the substrate is plasma-doped with the impurity; and the plasma doping condition may be set so that a temperature distribution across the substrate is such that the temperature in the peripheral portion of the substrate is equal to that in the central portion of the substrate.

As a result of experiments by the present inventors, it was possible to obtain a time period in which the gradient of the dose distribution across the substrate surface is reversed, by varying the distribution across the substrate surface of the concentration ratio ($B_2H_6$ concentration/He concentration) of the mixed gas of $B_2H_6$ and He, with a predetermined bias. It has also been found that in the time period of reversal, the uniformity in the post-annealing sheet resistance (Rs) across the substrate surface, i.e., the dose uniformity across the substrate surface, is very good over a relatively long period of time. The plasma doping method of the present invention is based on such a finding. Since the dose increases very slowly as the doping process time increases in the time period of reversal, if one sets the plasma doping time within the range of the process window including the time of reversal, there is obtained an effect that it is possible to easily control the dose with a high precision. Thus, it is possible to solve at once the problem with high-precision dose control including the control of the uniformity across the substrate surface, which has been considered the most significant problem in bringing plasma doping into practice.

In the plasma doping method of the present invention, the plasma doping condition may be changed after the second one of the doses in the central portion and in the peripheral portion of the substrate becomes greater than the first dose under the set plasma doping condition.

In the plasma doping method of the present invention, the plasma doping condition may be changed a plurality of times while the substrate is plasma-doped with the impurity.

In the plasma doping method of the present invention, the gas may contain molecules $B_mH_n$ (where m and n are natural numbers) composed of boron atoms and hydrogen atoms.

In the plasma doping method of the present invention, the gas may be a mixed gas of $B_2H_6$ and He. In such a case, it is preferred that the concentration of $B_2H_6$ in the mixed gas is greater than or equal to 0.01% by mass and less than or equal to 1% by mass.

In the plasma doping method of the present invention, the gas may contain $BF_3$, $AsH_4$ or $PH_3$.

In the plasma doping method of the present invention, the substrate may be a silicon substrate.

Effects of the Invention

As described above, according to the plasma doping method of the present invention, the vicinity of the point in time at which the shape of the dose distribution across the substrate surface is reversed is set as the end point of the plasma doping time. Thus, it is possible to increase the process window, whereby it is possible to control the dose with a high precision, and to stably and uniformly form in the substrate surface an impurity region in which the dose is controlled with a high precision.

BRIEF DESCRIPTION OF THE DRAWINGS

FIGS. 12A to 12H show the change over time of the sheet resistance across the substrate surface in the plasma doping method according to the fourth embodiment of the present invention.

FIG. 16 shows the relationship between the plasma doping time and the average value of the sheet resistance and the uniformity across the substrate surface thereof in the plasma doping method according to the fourth embodiment of the present invention.

DESCRIPTION OF REFERENCE NUMERALS

Figure 1:
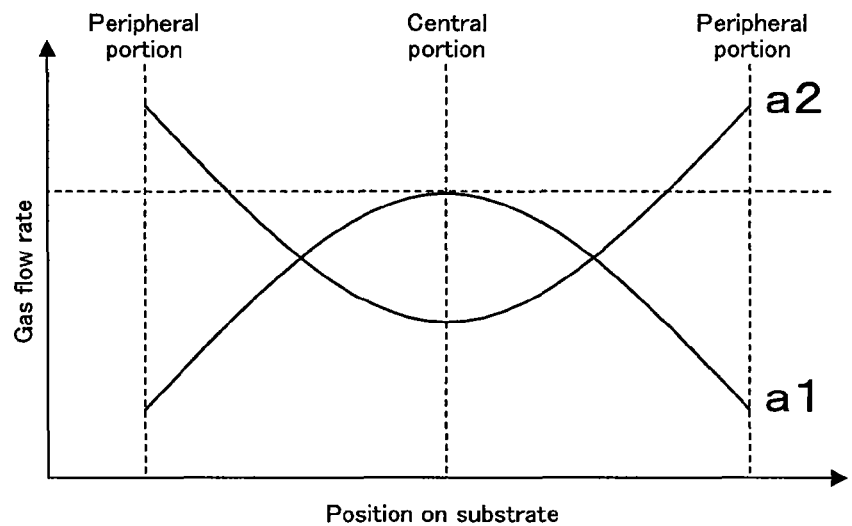
FIG. 1 shows an example of how the plasma doping condition is set in the plasma doping method according to a first embodiment of the present invention.

1 Vacuum chamber
2 First gas supplying device
3 Turbomolecular pump
4 Pressure controlling valve
5 High-frequency power supply
6 Sample stage
7 Dielectric window
8 Coil
9 Subject substrate
10 High-frequency power supply
11 Exhaust port
12 Pipe
13 First groove 14 First gas ejection port
15 Second gas supplying device
16 Pipe
17 Second groove
18 Second gas ejection port
19 Through hole
20 Through hole
21 Tubular liner
22 Access hole
23 Gas supply port
24 Tubular liner
25 Liner exhaust port
26 On-axis jet nozzle
27 Off-axis jet nozzle
30 Flow rate controller
31 Flow rate controller
32 First gas supply line
33 Second gas supply line

BEST MODE FOR CARRYING OUT THE INVENTION

First Embodiment

A plasma doping method according to a first embodiment of the present invention will now be described with reference to the drawings.

The plasma doping method of the present embodiment is characterized in that the method makes use of the phenomenon that the magnitude relationship between the dose in the substrate central portion and that in the substrate peripheral portion is reversed as the doping process time increases, and that the method uses the time at which the magnitude relationship is reversed, i.e., the time at which the dose in the substrate central portion and that in the substrate peripheral portion are equal to each other, as the process window of plasma doping time.

Thus, in the plasma doping method of the present embodiment, the substrate is plasma-doped with an impurity under a plasma doping condition set with respect to the dose of the impurity to be introduced into the substrate so that a first one of doses in the central portion and in the peripheral portion of the substrate is greater than a second one of the doses during an initial period of doping, with the second dose becoming greater than the first dose thereafter. In the present embodiment, the plasma doping condition is set so that the distribution of the dose of the impurity across the principal plane of the substrate is in rotational symmetry during the initial period of doping.

More specifically, an extent of time over which the dose of the impurity introduced into the silicon substrate (silicon wafer) being the subject substrate is substantially uniform across the substrate surface under a plasma doping condition set so that the dose distribution across the substrate surface has a predetermined gradient during an initial period of doping, with the gradient of the distribution being reversed thereafter, is pre-detected before the silicon substrate is plasma-doped, and the silicon substrate is plasma-doped with the impurity by using a predetermined plasma doping time that is included within the extent of time. Thus, it is possible to stably, and with a high level of uniformity across the substrate, form an impurity region in which an impurity concentration is controlled with a high precision.

FIG. 1 shows an example of how the plasma doping condition is set in the plasma doping method of the present embodiment. Specifically, the plasma doping condition is set so that the distribution of the flow rate of the gas (plasma-generating gas) across the substrate surface is such that the flow rate is greater on the substrate central portion and smaller on the substrate peripheral portion, i.e., such that the flow rate has a predetermined gradient, during an initial period of doping, as shown by the curve a1 in FIG. 1. Then, after some doping process time, the plasma doping condition is changed so that the distribution of the flow rate of the gas across the substrate surface is such that the flow rate is smaller on the substrate central portion and greater on the substrate peripheral portion, as shown by the curve a2 in FIG. 1. Thus, it is possible to make the amount of increase of dose per unit time smaller in the substrate central portion than in the substrate peripheral portion.

After the plasma doping process, annealing is performed, whereby the impurity introduced into the substrate is activated to be carriers. The dose can be calculated by activating the introduced impurity through annealing as described above and measuring the sheet resistance in the substrate due to the activated impurity. If annealing is performed with a large amount of heat, the impurity introduced in the substrate is all activated to be carriers, resulting in a small sheet resistance. In other words, the sheet resistance and the dose are substantially in inverse proportion to each other.

In the present embodiment (and also in the second and subsequent embodiments), annealing is performed at 1075° C. for 20 seconds before measuring the sheet resistance. With such annealing conditions including a high temperature and a relatively long time, it can be assumed that the impurity is electrically activated substantially completely. Thus, the sheet resistance and the dose will be in one-to-one correspondence, and the distribution of the sheet resistance can be converted to the distribution of the dose.

The sheet resistance was measured at 121 points across the substrate surface of a substrate (wafer) having a diameter of 300 mm, excluding an edge portion thereof (a width of 3 mm). Thus, the sheet resistance to be discussed below is the average of the sheet resistance values measured at 121 points, unless otherwise indicated. The sheet resistance uniformity across the substrate surface was obtained by the standard deviation of the sheet resistance values measured at 121 points.

Figure 2:
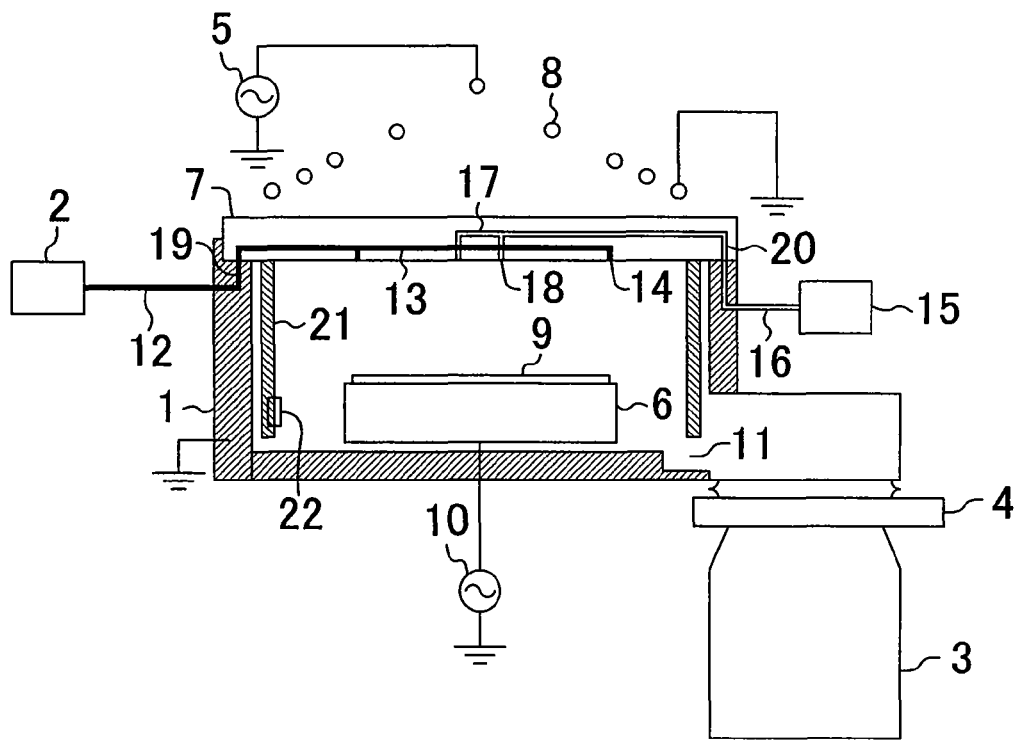
FIG. 2 is a cross-sectional view showing an example of a configuration of a plasma doping apparatus for use in carrying out the plasma doping method according to the first embodiment of the present invention.

FIG. 2 is a cross-sectional view showing an example of a configuration of a plasma doping apparatus for use in carrying out the plasma doping method of the present embodiment.

The plasma doping apparatus shown in FIG. 2 includes, as main components thereof, a vacuum chamber 1, a sample stage 6 provided in the vacuum chamber 1 for receiving a subject substrate 9 mounted thereon, a first gas supplying device 2 and a second gas supplying device 15 for supplying gases into the vacuum chamber 1, a turbomolecular pump 3 as an exhauster for exhausting the vacuum chamber 1, a pressure controlling valve 4 as a pressure controlling device for controlling the pressure inside the vacuum chamber 1, and a high-frequency power supply 5 and a coil 8 for generating a plasma in the vacuum chamber 1. The vacuum chamber 1 is exhausted through an exhaust port 11. Moreover, a tubular liner (inner chamber) 21 is placed in the vacuum chamber 1, whereby it is possible to suppress the disturbance of the gas in the vacuum chamber 1, which occurs due to an access hole for the subject substrate 9, etc., and to make the gas distribution in the vacuum chamber 1 concentric. An access hole 22 for the subject substrate 9 may be provided in the tubular liner 21. The plasma doping apparatus shown in FIG. 2 has two lines of gas supply, one including a first groove 13 and a first gas ejection port 14 and another including a second groove 17 and a second gas ejection port 18, which are provided in a dielectric window 7 being the ceiling portion of the vacuum chamber 1, for the purpose of controlling the gas distribution. Thus, it is possible to independently control the gas flow rate for each line. The first gas supplying device 2 supplies a gas to the first groove 13 through a pipe 12 and a through hole 19 in the inner wall of the vacuum chamber 1. The second gas supplying device 15 supplies the second groove 17 through a pipe 16 and a through hole 20 in the inner wall of the vacuum chamber 1.

In the present embodiment, the first gas supplying device 2 and the second gas supplying device 15 are both configured so as to supply a mixed gas of $B_2H_6$ and He ($B_2H_6$/He gas), and it is possible to vary the $B_2H_6$ concentration/He concentration over the range from 0.01% by mass/99.99% by mass to 1.0% by mass/99.0% by mass, and to adjust the flow rate of the $B_2H_6$/He gas over the range from 100 cc/min (standard state) to 600 cc/min (standard state).

With the plasma doping apparatus shown in FIG. 2, it is possible to introduce a predetermined gas into the vacuum chamber 1 from the gas supplying devices 2 and 15 and exhaust the chamber by the turbomolecular pump 3 as an exhauster, while the inside of the vacuum chamber 1 can be kept at a predetermined pressure by the pressure controlling valve 4. It is possible to generate an inductively-coupled plasma in the vacuum chamber 1 by supplying a high-frequency power of 13.56 MHz, for example, to the coil 8 provided in the vicinity of the dielectric window 7 opposing the sample stage 6 by means of the high-frequency power supply 5. As the subject substrate 9, the silicon substrate 9, for example, is mounted on the sample stage 6. A high-frequency power supply 10 for supplying a high-frequency power to the sample stage 6 is provided on the outside of the vacuum chamber 1, and the high-frequency power supply 10 functions as a voltage source for controlling the potential of the sample stage 6 so that the subject substrate 9 has a negative potential with respect to the plasma. The high-frequency power supply 10 is configured so as to supply a voltage to the sample stage 6 via a matcher (not shown).

Thus, it is possible to introduce an impurity into the subject substrate 9 by accelerating ions in the plasma toward the surface of the subject substrate 9 to make the ions impinge upon the surface. The gas supplied from the gas supplying devices 2 and 15 into the vacuum chamber 1 is discharged through the exhaust port 11 by the turbomolecular pump 3. The turbomolecular pump 3 and the exhaust port 11 are provided below the sample stage 6, for example. The pressure controlling valve 4 is an elevating valve located below the sample stage 6 and directly above the turbomolecular pump 3. The sample stage 6 is fixed to the vacuum chamber 1 by four posts (not shown), for example.

Figure 3:
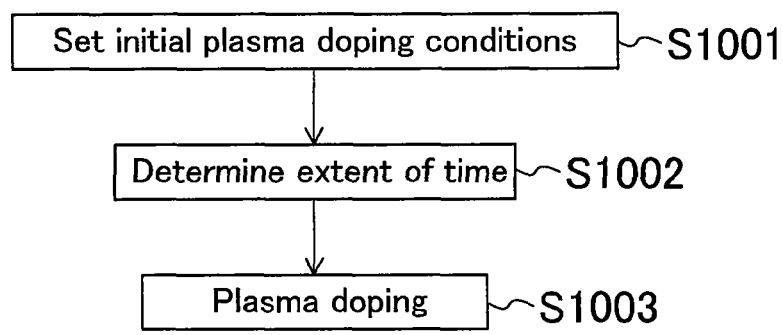
FIG. 3 is a flow chart of the plasma doping method according to the first embodiment of the present invention.

FIG. 3 is a flow chart showing a typical process flow of the plasma doping method of the present embodiment using the plasma doping apparatus shown in FIG. 2.

First, in step 1001, a plasma doping condition is set so that the distribution of the dose of the impurity to be introduced into the subject substrate 9 has a predetermined gradient across the surface of the subject substrate 9 during an initial period of doping, and the gradient of the distribution is reversed thereafter.

Then, in step 1002, an extent of time is determined such that the dose of the impurity to be introduced into the subject substrate 9 is substantially uniform across the substrate surface under the plasma doping condition set in step 1001.

Then, the subject substrate 9 is plasma-doped with the impurity by using a predetermined plasma doping time that is included within the extent of time as determined in step 1003.

A method for obtaining a gas flow rate distribution as shown by the curve a1 in FIG. 1 by using the plasma doping apparatus shown in FIG. 2 will now be described. For example, a cylinder filled with a $B_2H_6$ gas diluted with He to about 2% by mass and an He cylinder are provided for the gas supplying devices 2 and 15, respectively, in the plasma doping apparatus shown in FIG. 2. With the gas supplying devices 2 and 15, the $B_2H_6$ gas diluted with He to about 2% by mass is further diluted with He from the He cylinder, whereby a mixed gas of which the $B_2H_6$ concentration/He concentration is adjusted to 0.05% by mass/99.95% by mass is produced, and the mixed gas is supplied into the vacuum chamber 1 from the gas ejection ports 14 and 18. The gas supplying devices 2 and 15 are each provided with a mass flow controller (not shown), whereby the $B_2H_6$/He mixed gas is supplied from each of the gas ejection ports 14 and 18 at an independently-controlled flow rate. Then, by setting the plasma doping apparatus shown in FIG. 2 so that a mixed gas is ejected at a flow rate of 540 cc/min (standard state), for example, from the gas ejection port 18 corresponding to the central portion of the subject substrate 9 and a mixed gas is ejected at a flow rate of 180 cc/min (standard state), for example, from the gas ejection port 14 corresponding to the peripheral portion of the subject substrate 9, it is possible to obtain a distribution as shown by the curve a1 in FIG. 1 for the distribution of the flow rate of the mixed gas blown onto the subject substrate 9.

A gas flow rate distribution as shown by the curve a2 in FIG. 1 can be obtained by using settings such that a mixed gas is ejected at a flow rate of 180 cc/min (standard state), for example, from the gas ejection port 18 and a mixed gas is ejected at a flow rate of 540 cc/min (standard state), for example, from the gas ejection port 14.

In the present embodiment, the plasma doping condition is set so that the distribution of the flow rate of the gas across the substrate surface is such that the flow rate is greater on the substrate central portion and smaller on the substrate peripheral portion, as shown by the curve a1 in FIG. 1, during an initial period of doping. Thereafter, the plasma doping condition is changed so that the distribution of the flow rate of the gas across the substrate surface is such that the flow rate is smaller on the substrate central portion and greater on the substrate peripheral portion, as shown by the curve a2 in FIG. 1. The pressure inside the vacuum chamber 1, the source power (the power to be applied by the high-frequency power supply 5) and the bias power (the power to be applied by the high-frequency power supply 10) are not changed but kept constant throughout the doping process. Specifically, the pressure inside the vacuum chamber 1 is 0.9 Pa, the source power is 2000 W, and the bias power is 135 W.

Figure 4:
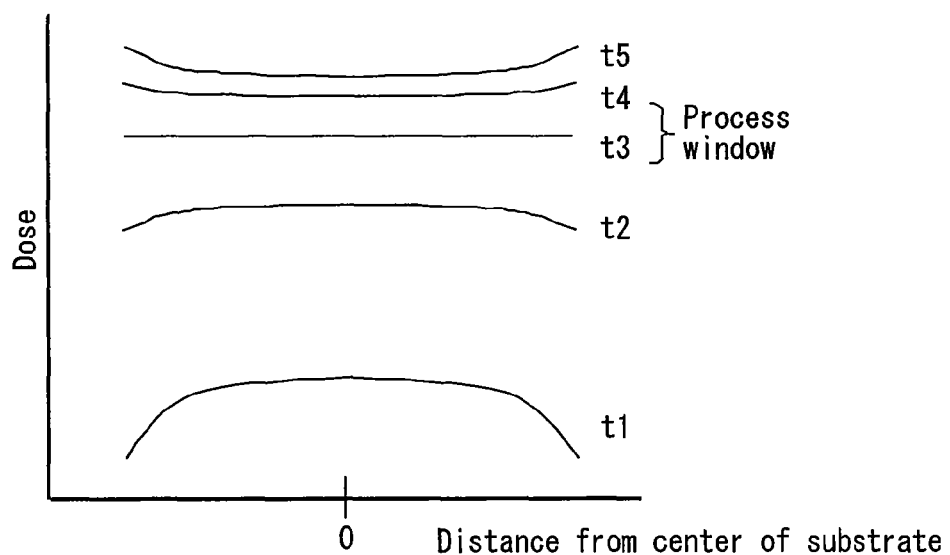
FIG. 4 shows the change over time of the dose across the substrate surface in the plasma doping method according to the first embodiment of the present invention.
Figure 5:
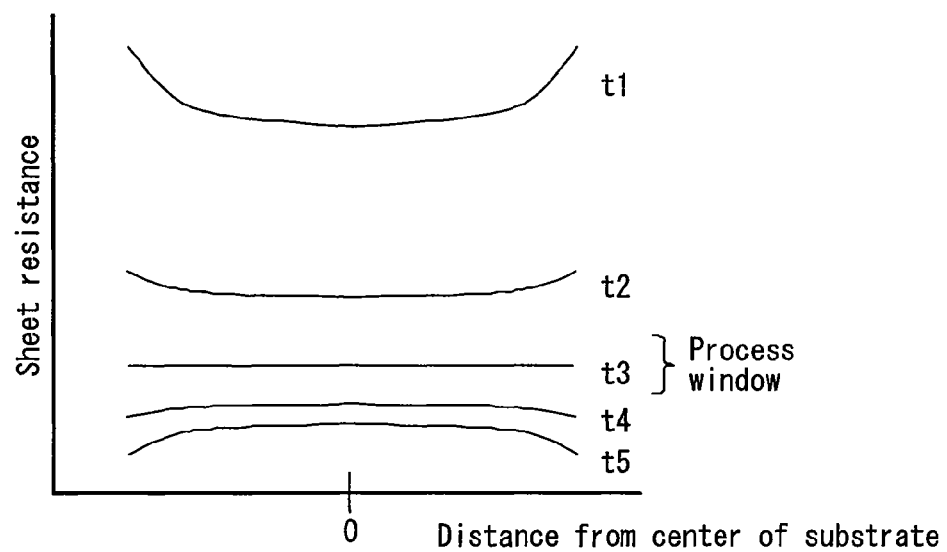
FIG. 5 shows the change over time of the sheet resistance across the substrate surface in the plasma doping method according to the first embodiment of the present invention.

FIG. 4 shows the change over time of the dose across the substrate surface in a case where the plasma doping condition is set as described above. The dose shown in FIG. 4 is obtained by converting the value of the sheet resistance shown in FIG. 5 to be discussed later. As shown in FIG. 4, during an initial period of doping (process time t1), the dose in the central portion of the subject substrate 9 is greater than that in the peripheral portion of the subject substrate 9. Then, the gas flow rate setting is changed as shown by the curve a2 in FIG. 1 between the process time t1 and the process time t2 (t2>t1). Thus, the amount of increase of dose per unit time is smaller in the substrate central portion than in the substrate peripheral portion. Therefore, as the process time increases from t2 to t3, t4, t5 (t5>t4>t3>t2), the dose in the central portion of the subject substrate 9 becomes smaller than that in the peripheral portion of the subject substrate 9. In other words, the dose profile is reversed. If the vicinity of the process times (t3, t4) when the reversal occurs is used as the process window of plasma doping time, it is possible to prevent the dose profile from varying significantly even when the plasma doping time varies. Thus, it is possible to reduce the variation in the distribution of the sheet resistance, which corresponds to the dose, across the substrate surface. FIG. 5 shows the change over time of the sheet resistance across the substrate surface. As shown in FIGS. 4 and 5, it can be seen that a profile with a very desirable uniformity across the substrate surface is obtained, both with the dose and with the sheet resistance, in the vicinity of the process times (t3, t4) when the profile reversal occurs.

Thus, according to the present embodiment, it is possible to form a more uniform dose distribution across the wafer surface with a high throughput.

In the present embodiment, a uniform dose distribution across the wafer surface is obtained by changing the flow rate of the gas supplied from the first gas supplying device 2 and the second gas supplying device 15 during a plasma doping process. Similar effects can be obtained by changing other parameters as discussed below.

For example, the concentration of the gas may be selected as an alternative parameter, wherein the gas concentration distribution across the substrate surface is adjusted as shown by the curve a1 and the curve a2 in FIG. 1 in accordance with the doping process time. First, a method for obtaining a gas concentration distribution as shown by the curve a1 (assuming that the vertical axis of FIG. 1 represents the gas concentration) by using the plasma doping apparatus shown in FIG. 2 will be described. For example, a cylinder filled with a $B_2H_6$ gas diluted with He to about 2% by mass and an He cylinder are provided for the gas supplying devices 2 and 15, respectively, in the plasma doping apparatus shown in FIG. 2. When the $B_2H_6$ gas diluted with He to about 2% by mass is further diluted with He from the He cylinder in the gas supplying devices 2 and 15, the dilution ratio is set separately for each gas supplying device. Specifically, a mixed gas of which the $B_2H_6$ concentration/He concentration is adjusted to 0.01% by mass/99.99% by mass, for example, is supplied from the gas ejection port 14. On the other hand, a mixed gas of which the $B_2H_6$ concentration/He concentration is adjusted to 0.05% by mass/99.95% by mass, for example, is supplied from the gas ejection port 18. The gas supplying devices 2 and 15 are each provided with a mass flow controller (not shown), whereby $B_2H_6$/He mixed gases are supplied from the gas ejection ports 14 and 18 at the same flow rate of 300 cc/min, for example. Thus, it is possible to realize a gas concentration distribution as shown by the curve a1 (assuming that the vertical axis of FIG. 1 represents the gas concentration). A gas concentration distribution as shown by the curve a2 (assuming that the vertical axis of FIG. 1 represents the gas concentration) can be obtained by using settings such that a mixed gas of which the $B_2H_6$ concentration/He concentration is adjusted to 0.01% by mass/99.99% by mass, for example, is ejected from the gas ejection port 18 and a mixed gas of which the $B_2H_6$ concentration/He concentration is adjusted to 0.05% by mass/99.95% by mass, for example, is ejected from the gas ejection port 14. It is possible to obtain a uniform dose distribution across the wafer surface by employing a plasma doping condition set so that the distribution of the concentration of the gas across the substrate surface is such that the concentration is greater on the substrate central portion and smaller on the substrate peripheral portion as shown by the curve a1 (assuming that the vertical axis of FIG. 1 represents the gas concentration) during an initial period of doping, and changes the plasma doping condition thereafter so that the distribution of the concentration of the gas across the substrate surface is such that the concentration is smaller on substrate central portion and greater on the substrate peripheral portion as shown by the curve a2 (assuming that the vertical axis of FIG. 1 represents the gas concentration); in other words, by changing the concentration of the gas supplied from the first gas supplying device 2 and the second gas supplying device 15 during a plasma doping process.

As alternative parameters, the source power, the substrate temperature, etc., may be adjusted during a plasma doping process.

First, in a case where the source power is adjusted, an apparatus having two coils is used, wherein one coil is provided above the central portion of the substrate and the other coil is provided above the peripheral portion of the substrate. During the initial period of doping (the process time t1), the source power for the coil provided above the central portion of the substrate is made smaller and that for the coil provided above the peripheral portion of the substrate is made greater. Thereafter, between the process time t1 and the process time t2 (t2>t1), the source power for the coil provided above the central portion of the substrate is made greater and the source power for the coil provided above the peripheral portion of the substrate is made smaller, in contrast to the initial period of doping. Specifically, the greater source power is set to about 2200 W, for example, and the smaller source power is set to about 1000 W, for example. On the portion of the substrate corresponding to the coil for which the source power is set to be greater, sputtering is dominant in the sputtering-doping balance, whereby the dose is small. On the portion of the substrate corresponding to the coil for which the source power is set to be smaller, doping is dominant, whereby the dose is large. Therefore, as the process time increases from t2 to t3, t4, t5 (t5>t4>t3>t2), the dose in the central portion of the substrate becomes smaller than that in the peripheral portion of the substrate. In other words, the dose profile is reversed. If the vicinity of the process times (t3, t4) when the reversal occurs is used as the process window of plasma doping time, it is possible to prevent the dose profile from varying significantly even when the plasma doping time varies. As described above, it is possible to obtain a uniform dose distribution across the wafer surface by changing the source power for generating a plasma during a plasma doping process.

Next, in a case where the substrate temperature is adjusted, one may employ the plasma doping apparatus shown in FIG. 2, for example, such that the entire upper surface of the sample stage 6 can be cooled with a coolant such as ethylene glycol, with a heater being provided for each of the central portion of the sample stage 6 and the peripheral portion thereof. With such an apparatus, the coolant is cooled to 10° C., while the heating temperature of the heater for the central portion of the sample stage 6 is set to 90° C. and the heating temperature of the heater for the peripheral portion of the sample stage 6 is set to 50° C., for example. Then, the temperature of the central portion of the subject substrate 9 and the temperature of the peripheral portion of the subject substrate 9 can be controlled to 70° C. and 30° C., respectively. Where it is desirable to reverse the temperature relationship between the central portion and the peripheral portion of the subject substrate 9, the heating temperatures of the heaters may be reversed. With such an apparatus configuration, it is possible to separately set the temperature of the substrate central portion and the temperature of the substrate peripheral portion.

First, a method for obtaining a substrate temperature distribution as shown by the curve a1 (assuming that the vertical axis of FIG. 1 represents the substrate temperature) by using an apparatus configuration as described above will be described. In such a case, the heating temperature of the heater for the central portion of the sample stage 6 is set to be high and the heating temperature of the heater for the peripheral portion of the sample stage 6 is set to be low. For example, the heating temperature of the heater for the central portion of the sample stage 6 is set to 90° C., and the heating temperature of the heater for the peripheral portion of the sample stage 6 is set to 50° C. Then, it is possible to obtain a substrate temperature distribution in which the temperature of the substrate central portion is set to 70° C. and the temperature of the substrate peripheral portion is set to 30° C., i.e., a substrate temperature distribution as shown by the curve a1 (assuming that the vertical axis of FIG. 1 represents the substrate temperature).

Next, a method for obtaining a substrate temperature distribution as shown by the curve a2 (assuming that the vertical axis of FIG. 1 represents the substrate temperature) by using an apparatus configuration as described above will be described. In such a case, the heating temperature of the heater for the central portion of the sample stage 6 is set to 50° C. and the heating temperature of the heater for the peripheral portion of the sample stage 6 is set to 90° C., for example. Thus, it is possible to obtain a substrate temperature distribution in which the temperature of the substrate central portion is set to 30° C. and the temperature of the substrate peripheral portion is set to 70° C., i.e., a substrate temperature distribution as shown by the curve a2 (assuming that the vertical axis of FIG. 1 represents the substrate temperature).

In plasma doping, more gas constituent particles or radicals are adsorbed onto the substrate when the substrate temperature is higher than when the substrate temperature is lower. Therefore, across the substrate surface, the dose is higher in a portion of a higher temperature than in a portion of a lower temperature. Making use of this fact, the heating temperature of the heater for the central portion of the sample stage 6 is set to be high and the heating temperature of the heater for the peripheral portion of the sample stage 6 is set to be low during the initial period of doping (the process time t1). Then, between the process time t1 and the process time t2 (t2>t1), the heating temperature of the heater for the central portion of the sample stage 6 is set to be low and the heating temperature of the heater for the peripheral portion of the sample stage 6 is set to be high, as opposed to the initial period of doping. Thus, the dose in the central portion of the substrate becomes smaller than that in the peripheral portion of the substrate as the process time increases from t2 to t3, t4, t5 (t5>t4>t3>t2). In other words, the dose profile is reversed. If the vicinity of the process times (t3, t4) when the reversal occurs is used as the process window of plasma doping time, it is possible to prevent the dose profile from varying significantly even when the plasma doping time varies. As described above, it is possible to obtain a uniform dose distribution across the wafer surface by changing the substrate temperature during a plasma doping process.

Second Embodiment

A plasma doping method according to a second embodiment of the present invention will now be described with reference to the drawings.

In the first embodiment described above, the plasma doping condition is set so that the impurity dose distribution across the principal plane of the substrate is in rotational symmetry during the initial period of doping. In contrast, in the present embodiment, plasma doping condition is set so that the impurity dose distribution across the principal plane of the substrate has a gradient along at least one diameter passing through the center of the substrate during the initial period of doping, after which the plasma doping condition is changed so that the gradient in the distribution is reversed.

Figure 6:
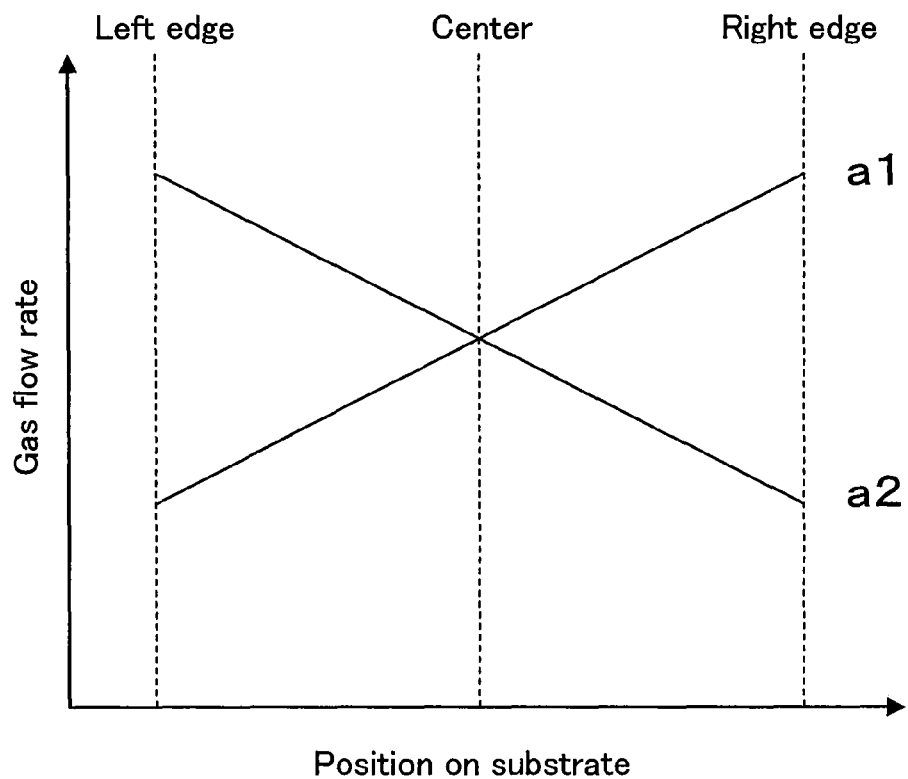
FIG. 6 shows an example of how the plasma doping condition is set in the plasma doping method according to a second embodiment of the present invention.

FIG. 6 shows an example of how the plasma doping condition is set in the plasma doping method of the present embodiment. Specifically, the plasma doping condition is set so that the distribution of the flow rate of the gas (plasma-generating gas) across the substrate surface is such that the flow rate is greater at the right edge of the substrate (hereinafter referring to the right end of at least one diameter passing through the center of the substrate) and smaller at the left edge of the substrate (hereinafter referring to the left end of at least one diameter passing through the center of the substrate) as shown by the straight line a1 in FIG. 6 during the initial period of doping. Then, after some doping process time, the plasma doping condition is changed so that the distribution of the flow rate of the gas across the substrate surface is such that the flow rate is smaller at the right edge of the substrate and greater at the left edge of the substrate as shown by the straight line a2 in FIG. 6. Instead of the gas flow rate, the parameter to be adjusted may be the gas concentration, the source power or the substrate temperature, as in the first embodiment.

Figure 7:
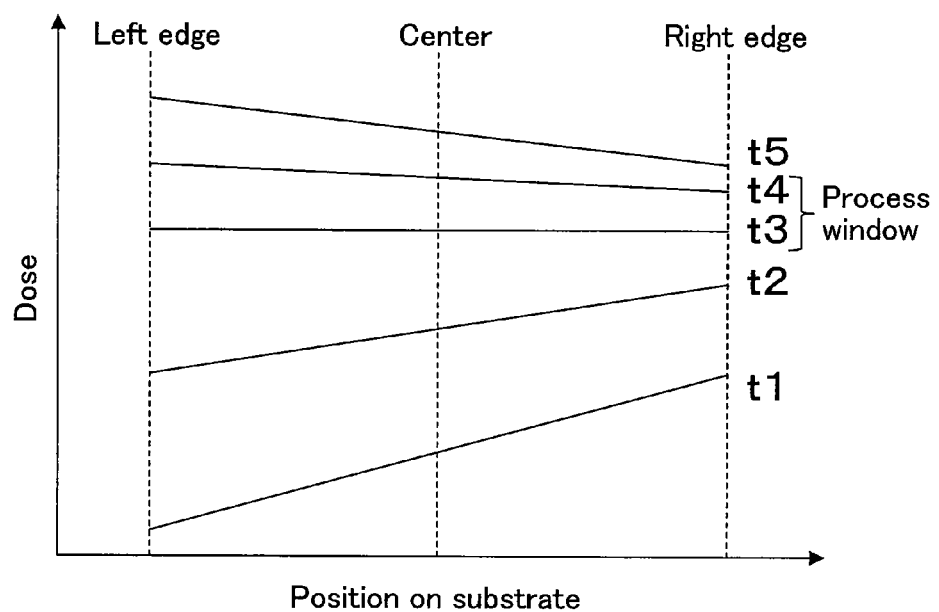
FIG. 7 shows the change over time of the dose across the substrate surface in the plasma doping method according to the second embodiment of the present invention.
Figure 8:
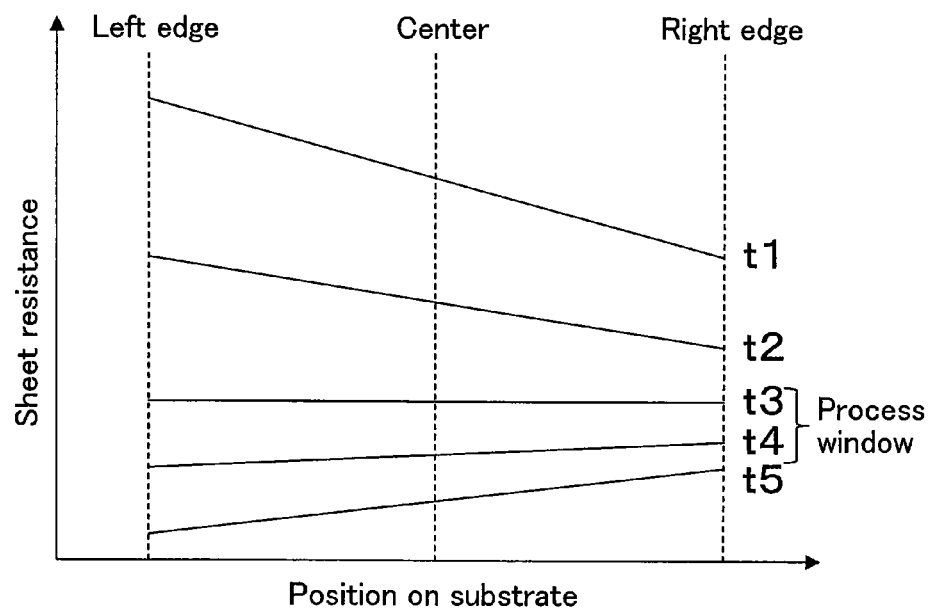
FIG. 8 shows the change over time of the sheet resistance across the substrate surface in the plasma doping method according to the second embodiment of the present invention.

FIG. 7 shows the change over time of the dose across the substrate surface in a case where the plasma doping condition is set as described above. As shown in FIG. 7, the dose at the right edge of the substrate is greater than the dose at the left edge of the substrate during the initial period of doping (the process time t1). Then, between the process time t1 and the process time t2 (t2>t1), the gas flow rate setting is changed as shown by the straight line a2 in FIG. 7. Thus, the amount of increase of dose per unit time will be smaller at the right edge of the substrate than at the left edge of the substrate. Therefore, the dose at the left edge of the substrate becomes smaller than the dose at the right edge of the substrate as the process time increases from t2 to t3, t4, t5 (t5>t4>t3>t2). In other words, the dose profile is reversed. If the vicinity of the process times (t3, t4) when the reversal occurs is used as the process window of plasma doping time, it is possible to prevent the dose profile from varying significantly even when the plasma doping time varies. Thus, it is possible to reduce the variation in the distribution of the sheet resistance, which corresponds to the dose, across the substrate surface. FIG. 8 shows the change over time of the sheet resistance across the substrate surface, obtained by converting dose values shown in FIG. 7 to sheet resistance values. As shown in FIGS. 7 and 8, it can be seen that a profile with a very desirable uniformity across the substrate surface is obtained, both with the dose and with the sheet resistance, in the vicinity of the process times (t3, t4) when the profile reversal occurs.

As described above, according to the second embodiment, the condition is set so that the dose distribution varies across the substrate in the diameter direction thereof, and as doping is continued, there is a timing at which the gradient of the dose distribution is reversed, and this timing exists stably over a relatively long period of time. Specifically, as plasma doping starts, the dose first increases significantly, but the increase of dose becomes very small as the process time elapses. By using such a time period in which the increase of dose becomes very small, i.e., the timing at which the gradient of the dose distribution is reversed, as the process window of plasma doping time, it is possible to accurately control the dose.

An extent of time over which the dose of the impurity to be introduced into the subject substrate is substantially uniform in the substrate diameter direction under a plasma doping condition set so that the dose distribution in the substrate diameter direction has a predetermined gradient during an initial period of doping, with the gradient of the distribution being reversed thereafter, is pre-detected before the subject substrate is plasma-doped, and the subject substrate is plasma-doped with the impurity by using a predetermined plasma doping time that is included within the extent of time. Then, an impurity region in which an impurity concentration is controlled with a high precision can be formed stably and with a high level of uniformity across the substrate.

Third Embodiment

A plasma doping method according to a third embodiment of the present invention will now be described with reference to the drawings.

Figure 9:
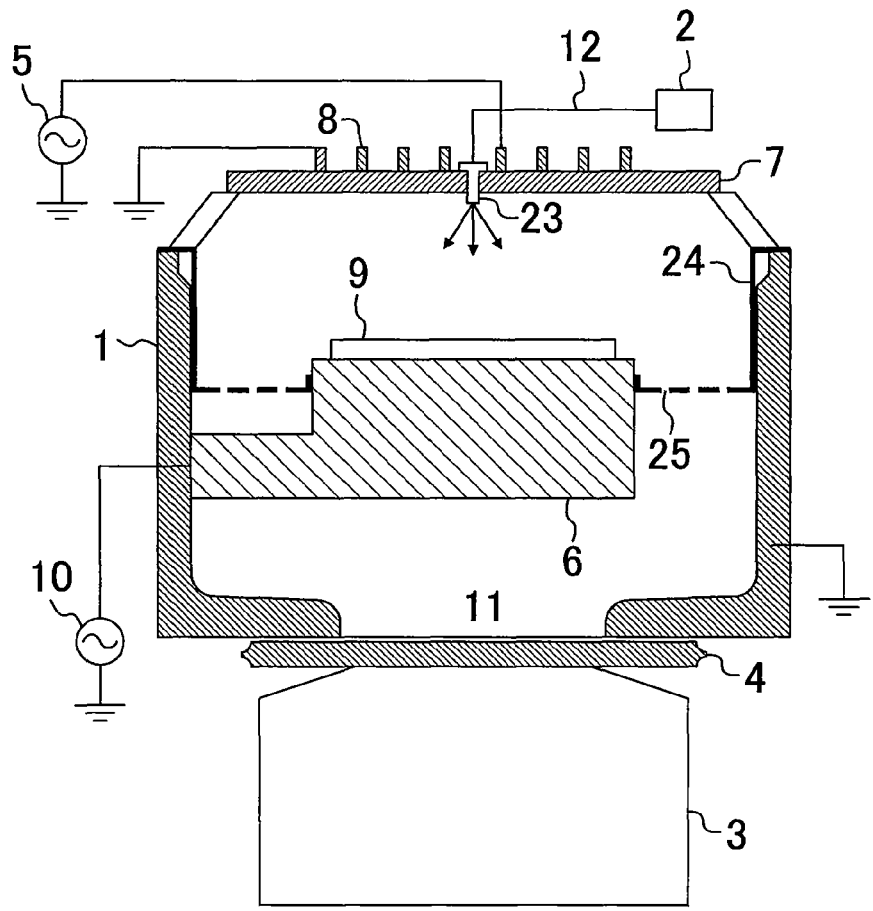
FIG. 9 is a cross-sectional view showing an example of a configuration of a plasma doping apparatus for use in carrying out the plasma doping method according to a third embodiment of the present invention.
Figure 10:
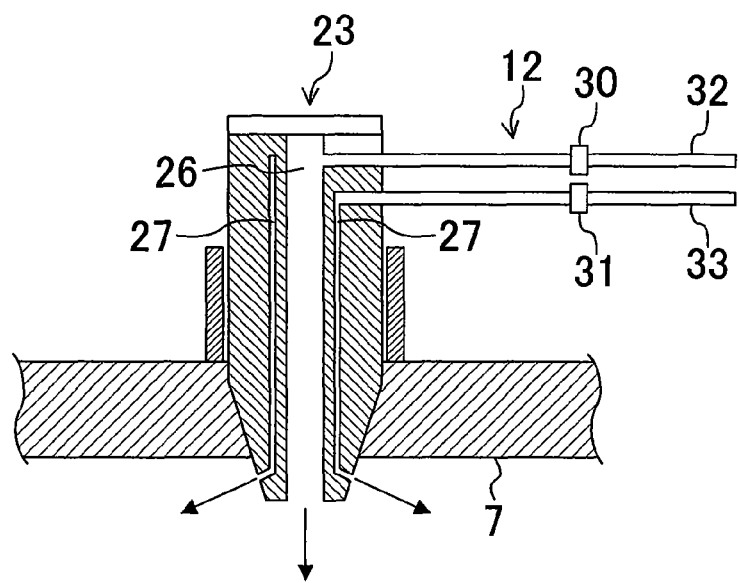
FIG. 10 is an enlarged cross-sectional view showing a gas supply port being an important part of the plasma doping apparatus shown in FIG. 9.

FIG. 9 is a cross-sectional view showing an example of a configuration of a plasma doping apparatus for use in carrying out the plasma doping method of the present embodiment, and FIG. 10 is an enlarged cross-sectional view showing a gas supply port being an important part of the plasma doping apparatus shown in FIG. 9. In the plasma doping apparatus shown in FIG. 9, like elements to those of the plasma doping apparatus shown in FIG. 2 and described above in the first embodiment are denoted by like reference numerals, and will not be described below.

The basic configuration of the plasma doping apparatus shown in FIGS. 9 and 10 is similar to that of the plasma doping apparatus shown in FIG. 2, but has differences as follows. Specifically, the plasma doping apparatus shown in FIGS. 9 and 10 is provided with only the first gas supplying device 2 as a single gas supplying device, and the first gas supplying device 2 is connected to a gas supply port 23 for supplying the gas into the vacuum chamber 1 from a generally-central portion of the upper surface of the vacuum chamber 1 through the pipe 12. Instead of the tubular liner (inner chamber) 21 of the plasma doping apparatus shown in FIG. 2, a tubular liner (inner chamber) 24 is provided so as to surround the sample stage 6 on which the subject substrate 9 is mounted, with a plurality of liner exhaust ports 25 being provided on the lower surface of the tubular liner 24 in rotational symmetry with respect to the sample stage 6. In the plasma doping apparatus shown in FIGS. 9 and 10, the locations of the sample stage 6, the turbomolecular pump 3, the pressure controlling valve 4, the exhaust port 11, etc., are different from those in the plasma doping apparatus shown in FIG. 2.

The gas supply port 23 being a characteristic of the plasma doping apparatus shown in FIGS. 9 and 10 includes an on-axis jet nozzle 26 and an off-axis jet nozzle 27 each passing through the dielectric window 7 provided on the upper surface of the vacuum chamber 1. The pipe 12 includes a first gas supply line 32 connected to the on-axis jet nozzle 26 and a second gas supply line 33 connected to the off-axis jet nozzle 27, and flow rate controllers 30 and 31 are provided separately for the gas supply lines 32 and 33, respectively. Thus, it is possible to independently eject gases from the on-axis jet nozzle 26 and from the off-axis jet nozzle 27 while controlling the flow rates and the concentrations thereof.

In the plasma doping apparatus shown in FIGS. 9 and 10, a gas is blown from the gas supply port 23 onto the subject substrate 9 from above the central portion of the subject substrate 9. Specifically, the gas supply lines 32 and 33 are both configured so as to supply a $B_2H_6$/He gas, and it is possible to vary the $B_2H_6$ concentration/He concentration over the range from 0.01% by mass/99.99% by mass to 1.0% by mass/99.0% by mass, and to adjust the flow rate of the $B_2H_6$/He gas over the range from 100 cc/min (standard state) to 600 cc/min (standard state). The gas supply lines 32 and 33 may supply $B_2H_6$/He gases of the same concentration while individually adjusting the flow rates, or may supply $B_2H_6$/He gases at the same flow rate while individually adjusting the gas concentrations.

In a case where the impurity dose distribution across the principal plane of the substrate is set to be in rotational symmetry with respect to the center of the substrate as in the first embodiment by using the plasma doping apparatus shown in FIGS. 9 and 10, many off-axis jet nozzles 27 are arranged at a predetermined interval in the peripheral portion of the nozzle of the gas supply port 23. In a case where the impurity dose distribution across the principal plane of the substrate is set to have a gradient along at least one diameter passing through the center of the substrate as in the second embodiment, two off-axis jet nozzles 27 are arranged in the direction of the diameter of the nozzle of the gas supply port 23.

With the plasma doping apparatus shown in FIGS. 9 and 10, it is possible to independently eject gases from the on-axis jet nozzle 26 and the off-axis jet nozzle 27 while controlling the flow rates thereof, wherein the gas ejected from the on-axis jet nozzle 26 is supplied to the central portion of the subject substrate 9, and the gas ejected from the off-axis jet nozzle 27 is supplied to the peripheral portion of the subject substrate 9. Thus, the on-axis jet nozzle 26 of the plasma doping apparatus shown in FIGS. 9 and 10 corresponds to the gas ejection port 18 of the plasma doping apparatus shown in FIG. 2, and the off-axis jet nozzle 27 of the plasma doping apparatus shown in FIGS. 9 and 10 corresponds to the gas ejection port 14 of the plasma doping apparatus shown in FIG. 2. Therefore, the plasma doping apparatus shown in FIGS. 9 and 10 can be applied not only to the present embodiment, but also to the first and second embodiments described above and a fourth embodiment to be described below.

Fourth Embodiment

A plasma doping method according to a fourth embodiment of the present invention will now be described with reference to the drawings.

Figure 11:
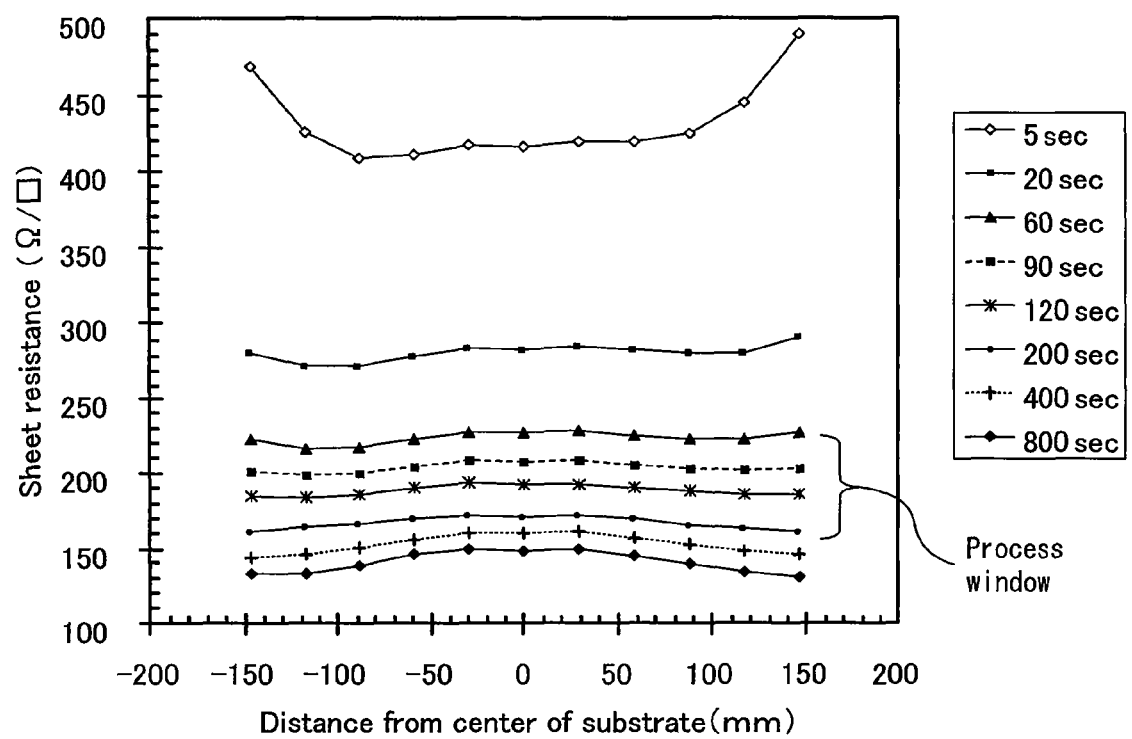
FIG. 11 shows the change over time of the sheet resistance across the substrate surface in the plasma doping method according to a fourth embodiment of the present invention.

FIGS. 11 and 12A to 12H show the change over time of the sheet resistance across the substrate surface in a case where the plasma doping method of the present embodiment is used. FIG. 11 shows the relationship between the distance from the center of the substrate and the sheet resistance for different process times. FIGS. 12A to 12H will later be discussed in detail.

As shown in FIG. 11, the present embodiment, as does the first embodiment, makes use of the fact that the relative magnitude relationship between the dose in the substrate central portion and that in the substrate peripheral portion is reversed as the doping process time elapses, wherein the present embodiment uses the time in which the magnitude relationship is reversed, i.e., the time in which the dose in the substrate central portion and that in the substrate peripheral portion are equal to each other, as the process window of plasma doping time. The present embodiment is different from the first embodiment as follows. In order to realize the technical characteristic described above, i.e., in order to reverse the magnitude relationship between the dose in the substrate central portion and that in the substrate peripheral portion, the first embodiment employs a method of changing a doping condition (parameter) during a plasma doping process. In contrast, the present embodiment utilizes the nature of a film containing an impurity such as boron (hereinafter referred to also as a "boron film") formed on the inner wall of the vacuum chamber.

In the present embodiment, as opposed to the first to third embodiments, the flow rate of the gas (plasma-generating gas), the gas concentration, the substrate temperature, the source power, etc., are set so that they are distributed as evenly as possible among different positions on the substrate, and these parameter values are kept constant during a plasma doping process. Therefore, by such parameter settings, the relative magnitude relationship between the dose in the substrate central portion and that in the substrate peripheral portion will not normally be reversed during a plasma doping process; in other words, the dose in the substrate central portion and that in the substrate peripheral portion will not be in balance during a plasma doping process. However, in the present embodiment, it is possible to cause the reversal phenomenon as described above by utilizing the nature of a boron film as will be described below.

First, a method for forming a boron film on the inner wall of the vacuum chamber will be described.

Figure 13:
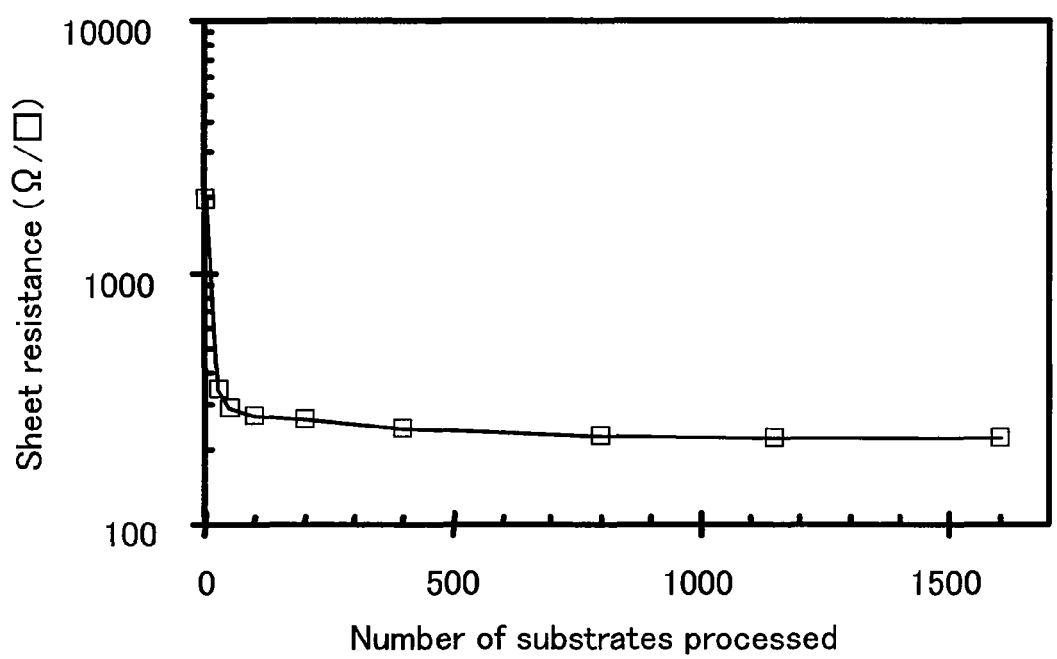
FIG. 13 shows the relationship between the number of substrates processed and the sheet resistance in the plasma doping method according to the fourth embodiment of the present invention.

For example, a boron film is formed on the inner wall of the vacuum chamber by performing a 60-second discharge about 1000 times by using a plasma generated from a $B_2H_6$/He gas of which the $B_2H_6$ concentration/He concentration is 0.05% by mass/99.95% by mass in a vacuum chamber. FIG. 13 shows the transition of substrate sheet resistance observed when a 60-second plasma doping process is performed 1600 times (i.e., on 1600 subject substrates) using a plasma generated from a $B_2H_6$/He gas with the plasma doping apparatus shown in FIG. 2 under conditions such that the pressure inside the vacuum chamber is 0.9 Pa, the source power is 2000 W, the $B_2H_6$ concentration/He concentration is 0.05% by mass/ 99.95% by mass, the flow rate of the $B_2H_6$/He gas is 300 cc/min (standard state) and the bias power is 135 W. As shown in FIG. 13, the formation of the boron film can be completed through about 1000 iterations of discharge (plasma doping process). As a result, the substrate sheet resistance does not vary but is stable from the $1000^{th}$ to $1600^{th}$ iterations of discharge. The sheet resistance obtained by a plasma doping process after the formation of the boron film was about 220Ω/ □. In contrast, the sheet resistance obtained by the first plasma doping process, i.e., a plasma doping process immediately after maintenance in which the inner wall of the vacuum chamber is washed with water and an organic solvent, was 1967Ω/□. Thus, the dose by a plasma doping process after the formation of a boron film is as high as about nine times that by a plasma doping process immediately after maintenance. Thus, after the formation of a boron film, it is possible to obtain an effect that doping of which the boron source is the boron film becomes a dominant factor for the dose as a whole, while it is possible to obtain a constant and stable dose, independent of the number of iterations of discharge (plasma doping process).

Next, a point that one should be particularly careful about with the configuration of the plasma doping apparatus used in the plasma doping method of the present embodiment will be described. As does the first embodiment, the present embodiment may use a plasma doping apparatus as shown in FIG. 2, and care should be taken with the configuration of the tubular liner 21 in such a case. First, the tubular liner 21 is preferably arranged in rotational symmetry with respect to the center of the substrate on the plane including the surface of the subject substrate 9. In other words, it is preferred that the intersection between the inner wall of the tubular liner 21 and the plane including the surface of the subject substrate 9 is a circle, and that the circle is a perfect circle. In a case where an opening 22 is provided in the tubular liner 21 for transferring the subject substrate 9, the opening 22 is provided so that it is not located on the circle being the intersection between the inner wall of the tubular liner 21 and the plane including the surface of the subject substrate 9. In a case where the opening 22 is located on the circle, a lid that covers the opening 22 may be provided. Alternatively, the opening 22 may be provided so that it is located on the circle while transferring the subject substrate 9, but is located vertically below the circle during a plasma doping process after transferring the subject substrate 9 by moving the sample stage 6 together with the subject substrate 9 in the vertically upward direction. Then, the boron film can be formed in rotational symmetry with respect to the center of the substrate. As described above, after the formation of a boron film, doping of which the boron source is the boron film becomes dominant for the dose as a whole, whereby by using an apparatus configuration as described above capable of forming a boron film in rotational symmetry with respect to the center of the substrate, the impurity dose distribution across the principal plane of the substrate can easily be made in rotational symmetry with respect to the center of the substrate.

Next, the process window of plasma doping time in the plasma doping method of the present embodiment will be described. The process window is used when performing a plasma doping process, after depositing a boron film on the inner wall of the tubular liner 21 in advance, with the plasma doping apparatus shown in FIG. 2 having the tubular liner 21 designed so that the circle being the intersection between the inner wall of the tubular liner 21 and the plane including the surface of the subject substrate 9 is arranged in rotational symmetry with respect to the center of the substrate as described above. Thus, it is possible to more stably obtain a dose distribution with high uniformity across the substrate surface.

When a bias is applied while a silicon substrate is irradiated with a plasma ($B_2H_6$/He plasma) generated from a mixed gas of $B_2H_6$ and He ($B_2H_6$/He gas), there is a time period over which the doping of boron into the silicon substrate and the sputtering of boron from the boron film on the vacuum chamber inner wall are in balance with each other. Specifically, as plasma irradiation starts, the dose first increases significantly, but there is a time period over which the dose increases very slowly over time. By using the time period over which the dose increases very slowly as the process window of plasma doping time, it is possible to control the dose more accurately.

Next, a unique effect that is obtained when performing a plasma doping process with a plasma doping apparatus with a boron film formed on the inner wall of the vacuum chamber will be described. The amount of boron supplied into the plasma through sputtering from the boron film is small during an initial period of doping (the process time of up to about five seconds), and increases as the process time increases (about 20 seconds). It is believed that this is because the temperature of the vacuum chamber inner wall increases due to heating by the plasma as the process time increases, whereby boron is more easily sputtered from the boron film after some process time than during the initial period of doping.

Figure 14:
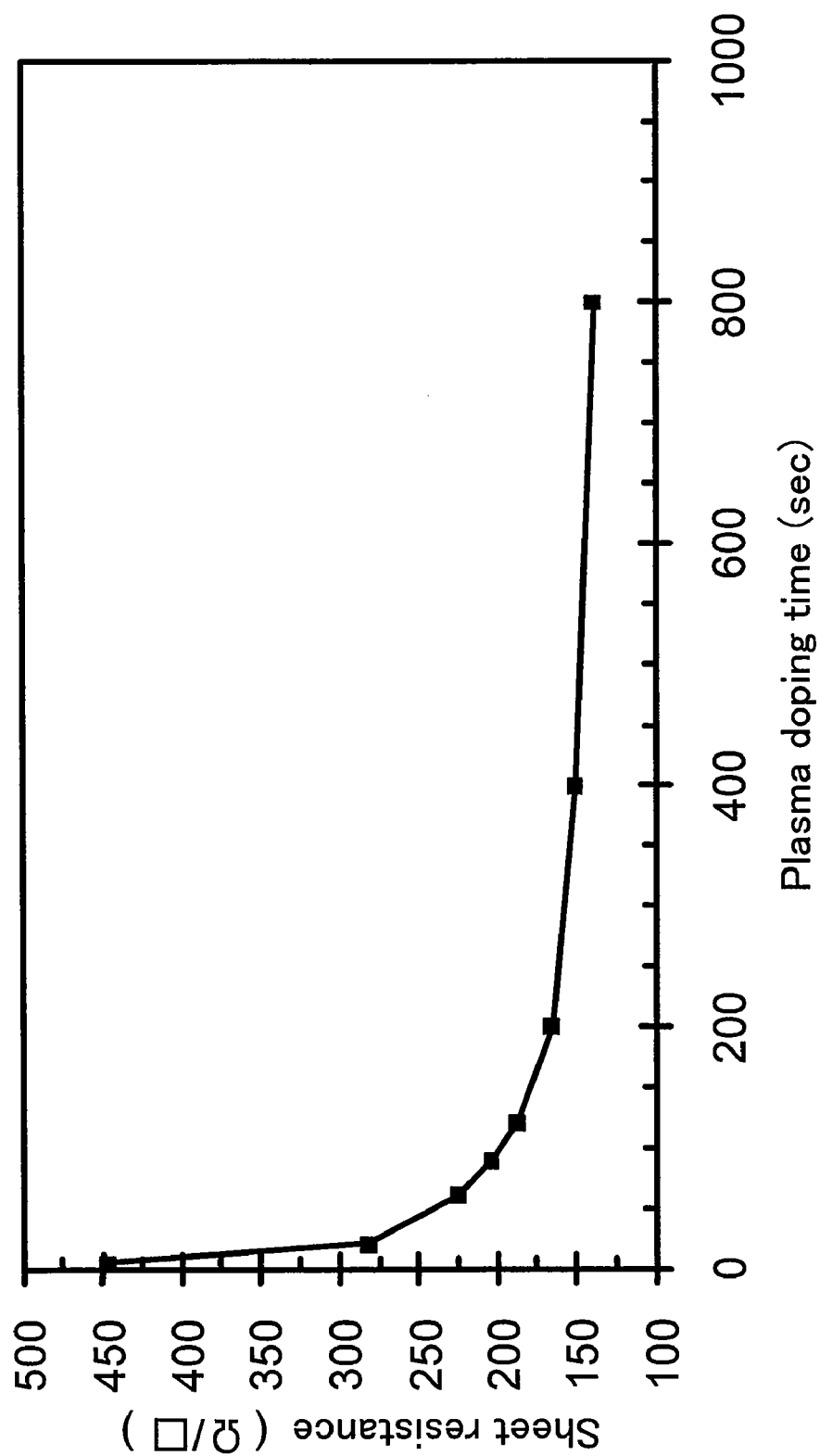
FIG. 14 shows the relationship between the plasma doping time and the sheet resistance in the plasma doping method according to the fourth embodiment of the present invention.

FIG. 14 shows the relationship between the plasma doping time and the sheet resistance observed when the plasma doping time is varied over the range from 5 seconds to 800 seconds using a plasma generated from a $B_2H_6$/He gas with the plasma doping apparatus shown in FIG. 2 having a vacuum chamber with a deposited boron film under conditions such that the $B_2H_6$ concentration/He concentration is 0.05% by mass/99.95% by mass, the pressure inside the vacuum chamber is 0.9 Pa, the source power is 2000 W, the bias power is 135 W and the flow rate of the $B_2H_6$/He gas is 300 cc/min (standard state). As shown in FIG. 14, as the plasma doping time increases, the amount of boron supplied into the plasma through sputtering from the boron film increases, and the sheet resistance decreases. However, once the plasma doping time is somewhat long, the rate of increase of the amount of boron to be sputtered from the boron film decreases, whereby the sheet resistance slowly decreases.

As shown in FIGS. 11 and 12A, where the process time is as short as about five seconds, there is only a small amount of boron from the boron film in the plasma, the sheet resistance of the substrate peripheral portion will be higher than the sheet resistance of the substrate central portion. It is believed that in a case where the gas flow rate, the gas concentration, the substrate temperature and the source power are made as even as possible among different positions on the substrate as in the present embodiment, the dose distribution reflects the total sum of the effects from these parameters.

After some process time (about 20 seconds), the effect of the dose of the boron from the boron film attached to the vacuum chamber inner wall (the tubular liner 21 in the plasma doping apparatus shown in FIG. 2) becomes notable. Of course, boron from the boron film is more likely to be doped into the substrate peripheral portion where the distance from the boron film attached to the tubular liner 21 is shorter than the substrate central portion. Moreover, as described above, the dose by a plasma doping process after the formation of a boron film is as high as about nine times that by a plasma doping process immediately after maintenance. Therefore, as the process time elapses, the amount of increase of dose per unit time in the substrate peripheral portion becomes greater than that in the substrate central portion.

Thus, although the dose in the substrate peripheral portion is smaller than that in the substrate central portion as shown in FIG. 12A during an initial period of doping, the dose in the substrate peripheral portion and that in the substrate central portion come into balance after some process time, and the dose in the substrate peripheral portion thereafter becomes greater than that in the substrate central portion. In other words, the gradient of the dose distribution is reversed. FIGS. 12A, 12B and 12C show the transition in which the dose in the substrate peripheral portion and that in the substrate central portion come into balance, starting from the initial period of doping until some process time elapses. FIGS. 12C, 12D, 12E and 12F show the transition around the reversal of the gradient of the dose distribution. Particularly, FIGS. 12D and 12E show how the dose in the substrate peripheral portion and that in the substrate central portion remain in balance with each other. FIGS. 12F, 12G and 12H show the transition in which the gradient of the dose distribution is reversed so that the dose in the substrate peripheral portion becomes greater than that in the substrate central portion.

While FIGS. 12A to 12H show a distribution of the sheet resistance across the substrate surface that is obtained by annealing after a plasma doping process, the present inventors used SIMS (secondary ion mass spectrometry) to analyze the boron concentration without annealing other samples immediately after plasma doping (samples equivalent to the substrates to be measured of FIGS. 12A to 12H). As a result, the depth at which the boron concentration was $1 \times 10^{18}$ cm$^{-3}$ was 9 nm to 11 nm for all of the samples equivalent to the substrates to be measured of FIGS. 12A to 12H. The dose was $4.2 \times 10^{14}$ cm$^{-2}$ for a sample equivalent to the substrate to be measured of FIG. 12A, $8.7 \times 10^{14}$ cm$^{-2}$ for a sample equivalent to the substrate to be measured of FIG. 12B, $1.2 \times 10^{15}$ cm$^{2}$ for a sample equivalent to the substrate to be measured of FIG. 12C, $1.5 \times 10^{15}$ cm$^{2}$ for a sample equivalent to the substrate to be measured of FIG. 12D, $1.6 \times 10^{15}$ cm$^{-2}$ for a sample equivalent to the substrate to be measured of FIG. 12E, $2.0 \times 10^{15}$ cm$^{-2}$ for a sample equivalent to the substrate to be measured of FIG. 12F, $2.3 \times 10^{15}$ cm$^{-2}$ for a sample equivalent to the substrate to be measured of FIG. 12G, and $2.6 \times 10^{15}$ cm$^{-2}$ for a sample equivalent to the substrate to be measured of FIG. 12H.

Figure 15:
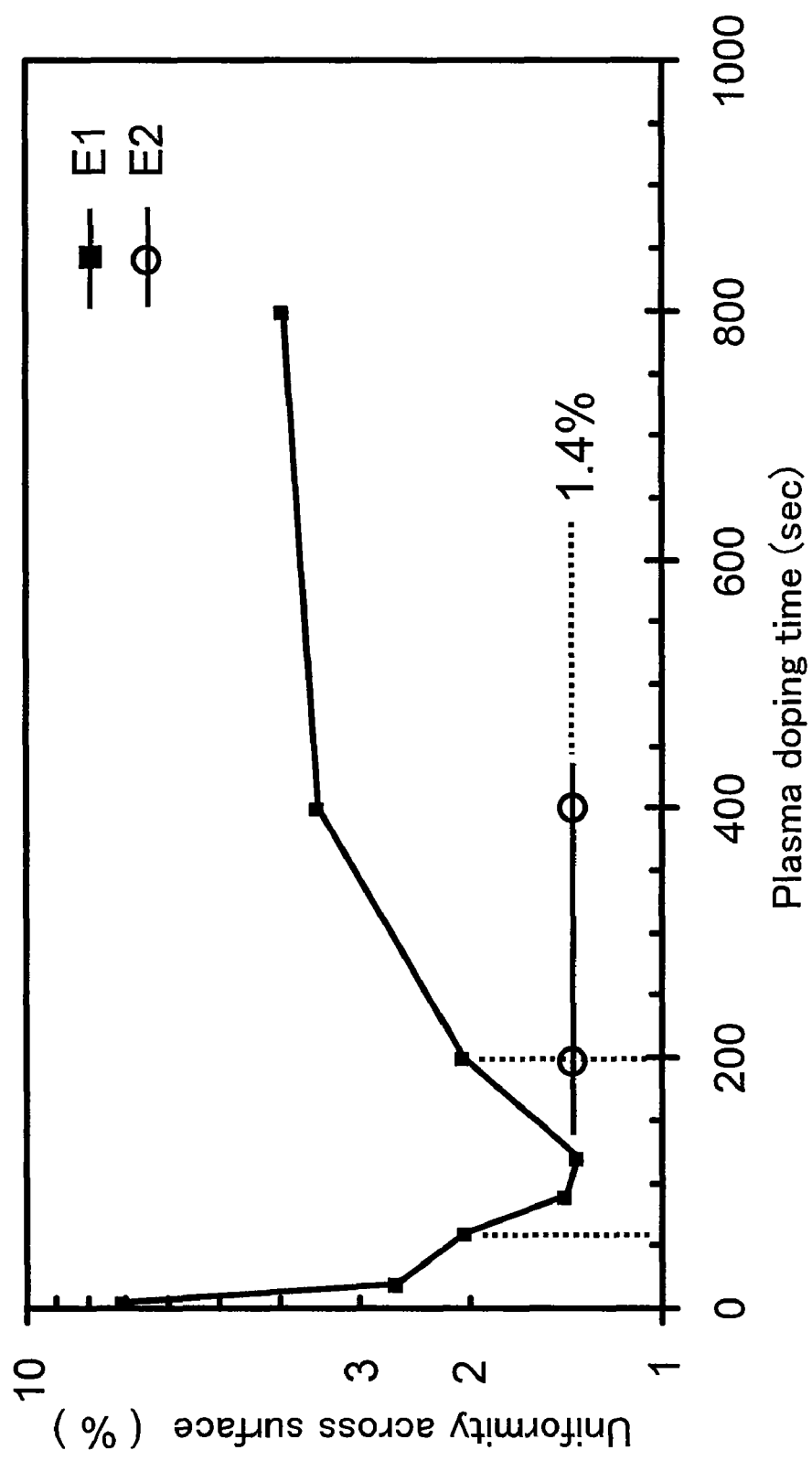
FIG. 15 shows the relationship between the plasma doping time and the uniformity of the sheet resistance across the substrate surface in the plasma doping method according to the fourth embodiment of the present invention.

FIG. 15 (the curve E1) shows the relationship between the plasma doping time and the uniformity of the sheet resistance across the substrate surface in the plasma doping method of the present embodiment. As shown in FIG. 15, by using the vicinity of the point in time at which the gradient of the dose distribution is reversed (the range of process time from 60 seconds to 200 seconds, corresponding to FIGS. 12C to 12F) as the process window of plasma doping time, it is possible to obtain a sheet resistance uniformity across the substrate surface of 2.0% or less in terms of 1σ. Moreover, in the time period where the dose in the substrate peripheral portion and that in the substrate central portion remain in balance with each other (the range of process time from 90 seconds to 120 seconds, corresponding to FIGS. 12D and 12E), it is possible to obtain a sheet resistance uniformity across the substrate surface of 1.4% in terms of 1σ. Particularly, at 120 seconds (the process time corresponding to FIG. 12E), which is closest to the point in time at which the gradient of the dose distribution is reversed, it is possible to obtain a sheet resistance uniformity across the substrate surface of 1.36% in terms of 1σ. Generally, as the value of 1σ decreases, the technical difficulty in further improving the uniformity increases tremendously. In fact, without using the present invention, it is very difficult to realize a sheet resistance uniformity across the substrate surface of 2% or less with a substrate (wafer) having a diameter of 300 mm, excluding an edge portion thereof (a width of 3 mm). Being able to easily realize a sheet resistance uniformity across the substrate surface of 1.4% or less with the present invention can be considered an indication of the effectiveness of the present invention.

While the plasma doping time herein refers to the length of time over which a bias is applied while the substrate is irradiated with a plasma, the results shown in FIGS. 12A to 12H are obtained by setting the plasma doping time to 5 seconds for FIG. 12A, 20 seconds for FIG. 12B, 60 seconds for FIG. 12C, 90 seconds for FIG. 12D, 120 seconds for FIG. 12E, 200 seconds for FIG. 12F, 400 seconds for FIG. 12G, and 800 seconds for FIG. 12H. As described above (see FIG. 13 and description therefor), the dose of the impurity to be introduced into the substrate is unstable until a boron film is formed on the inner wall of the vacuum chamber after maintenance in which the inner wall of the vacuum chamber is washed with water and an organic solvent. Therefore, after maintenance, conditioning was performed by successively performing a 60-second plasma doping process on more than 2000 dummy substrates, after which the sheet resistance was measured as shown in FIGS. 12A to 12H. FIGS. 12A to 12H each indicate the number of the substrate measured, including the dummy substrates. FIGS. 12A to 12H show the sheet resistance distribution across the substrate surface obtained by performing a boron plasma doping on a substrate (wafer) having a diameter of 300 mm and then annealing the substrate at 1075° C. for 20 seconds. The sheet resistance was measured at 121 points across the substrate surface of a substrate (wafer) having a diameter of 300 mm, excluding an edge portion thereof (a width of 3 mm). Of the measurement results shown in FIGS. 12A to 12H, FIG. 16 shows the average value of the sheet resistance and the uniformity across the substrate surface (1σ) relative to the plasma doping time.

According to the plasma doping method of the present embodiment, the impurity dose distribution across the principal plane of the substrate can be made in rotational symmetry with respect to the center of the substrate as shown in FIGS. 12A to 12H, FIG. 15 (the curve E1) and FIG. 16. Moreover, a uniformity across the substrate surface of 2.7% or less can be realized with the plasma doping time from 20 seconds to 200 seconds, and a uniformity across the substrate surface of 1.42% or less can be realized with the plasma doping time from 90 seconds to 120 seconds. Thus, in the vicinity of the point in time at which the gradient of the dose distribution across the substrate surface is reversed over time, a dose distribution with desirable uniformity across the substrate surface can be obtained over a predetermined amount of time. The reason is as follows. As some time elapses after the dose stops varying significantly over time, the dose in a portion of the substrate where the dose has been relatively small becomes close to the dose in a portion of the substrate where the dose has been relatively large, after which the former exceeds the latter, whereby there exists a time period over which a dose distribution with desirable uniformity across the substrate surface can be obtained around the point in time at which these doses come into balance with each other. Specifically, as compared with a case where only the period of time until the two doses come into balance with each other is used as the time period over which a dose distribution with desirable uniformity across the substrate surface can be obtained, it is possible to obtain a dose distribution with desirable uniformity across the substrate surface over substantially twice the length of time.

As described above, the plasma doping method of the present embodiment, capable of stably improving the sheet resistance uniformity across the substrate surface by using a predetermined period of time including the point in time at which the gradient of the dose distribution is reversed as the process window of plasma doping time, is very effective means for ensuring a uniformity across the substrate surface of the sheet resistance, i.e., the dose, in a plasma doping process. With the plasma doping method of the present embodiment, it is possible to control the dose with a high precision while ensuring a dose uniformity across the substrate surface, as described above.

As the method for reversing the gradient of the dose distribution, the present embodiment does not employ the method in which parameters are changed during a plasma doping process, but employs the method in which boron sputtering from a boron film formed on the inner wall of the vacuum chamber is utilized. In addition, parameter settings may be changed after the reversal of the gradient of the dose distribution or in the vicinity of the time of reversal. Particularly, if parameter settings are changed a plurality of times, the time period over which a desirable level of uniformity across the substrate surface of the sheet resistance, i.e., the dose, is maintained can be further elongated, as shown by the curve E2 in FIG. 15. Similarly, in the first to third embodiments, parameter settings may be changed once or a plurality of times after the reversal of the gradient of the dose distribution or in the vicinity of the time of reversal.

The embodiments of the present invention set forth above illustrate only some of the variations with respect to the configuration, shape, arrangement, etc., of the plasma doping apparatus, which can be realized by the application of the present invention. It is understood that the present invention can be applied to realize various variations other than those illustrated in the embodiments above.

While the first to fourth embodiments are directed to cases where the sample (subject substrate) is a semiconductor substrate of silicon, the present invention can be applied to processing of samples of various other materials. For example, the present invention is also effective in cases where the subject substrate is a strained silicon substrate or an SOI (semiconductor on insulator) substrate. The reason is that these substrates are similar to a silicon substrate in the structure of the surface portion, which is exposed to a plasma.

While the first to fourth embodiments are directed to cases where the introduced impurity is boron, the present invention is particularly effective if the impurity is boron, arsenic, phosphorus, aluminum or antimony in a case where the sample (subject substrate) is a semiconductor substrate of silicon. The reason is that with these impurities, it is possible to form a shallow junction in the transistor formation region. Where the introduced impurity is boron, a $B_2H_6$ gas is used in the first to fourth embodiments. However, the present invention is not limited to this, and a gas containing molecules $B_mH_n$ (where m and n are natural numbers) of boron atoms and hydrogen atoms or $BF_3$ may be used. Where the introduced impurity is arsenic, a gas containing $AsH_4$ may be used, for example, and where the introduced impurity is phosphorus, a gas containing $PH_3$ may be used.

In cases where the concentration of the gas containing an impurity is low, the present invention described in the first to fourth embodiments is effective, and is particularly effective as a plasma doping method in which it is required to control the dose with a high precision.

While plasma doping described in the first to fourth embodiments is directed to a case where the gas supplied into the vacuum chamber (reaction chamber) is a gas containing the doping material, the present invention is also effective in cases where the gas supplied into the reaction chamber does not contain the doping material, wherein the doping material is generated from the impurity in a solid form. Specifically, the present invention is also effective in cases where, for example, a solid substance including impurity atoms is placed in the reaction chamber, and the impurity atoms are made into a plasma by using a plasma of He, or the like, for performing a plasma doping process.

INDUSTRIAL APPLICABILITY

The plasma doping method of the present invention, with which a dose uniformity across the substrate surface can be realized, can improve the yield and is economical. Since it is possible to precisely control the amount of impurity to be introduced, it is possible to form an impurity region of a shallow junction. Therefore, the plasma doping method of the present invention is also useful in applications such as manufacturing thin-film transistors used in the filed of LCDs, in addition to the process of introducing an impurity into semiconductor.

The invention claimed is:

1. A plasma doping method for forming an impurity region in a surface of a substrate by exposing the substrate to a plasma generated from a gas containing an impurity in a vacuum chamber, wherein the substrate is plasma-doped with the impurity under a plasma doping condition set so that a dose of the impurity introduced into one portion of a central portion and a peripheral portion of the substrate is greater than a dose of the impurity introduced into the other portion of the central portion and the peripheral portion during an initial period of doping, and a dose of the impurity introduced into the other portion becomes greater than a dose of the impurity introduced into the one portion during a period subsequent to the initial period.

2. The plasma doping method of claim 1, wherein the substrate is plasma-doped with the impurity under the plasma doping condition set so that a dose in the central portion of the substrate is greater than a dose in the peripheral portion of the substrate during the initial period of doping, and a dose in the peripheral portion of the substrate becomes greater than a dose in the central portion of the substrate during the period subsequent to the initial period.

3. The plasma doping method of claim 1, wherein an extent of time over which doses in the central portion and in the peripheral portion of the substrate are substantially equal to each other under the set plasma doping condition is pre-detected before the substrate is plasma-doped with the impurity, and the substrate is plasma-doped with the impurity by using a predetermined plasma doping time that is included within the extent of time.

4. The plasma doping method of claim 1, wherein the plasma doping condition is set so that a distribution of the dose of the impurity across a principal plane of the substrate is in rotational symmetry with respect to a center of the substrate during the initial period of doping.

5. The plasma doping method of claim 1, wherein the plasma doping condition is set so that a distribution of the dose of the impurity across a principal plane of the substrate has a gradient along at least one diameter passing through a center of the substrate during the initial period of doping.

6. The plasma doping method of claim 1, wherein the plasma doping condition is changed while the substrate is plasma-doped with the impurity.

7. The plasma doping method of claim 6, wherein the changed plasma doping condition is set so that an amount of change per unit time of the dose in the central portion of the substrate and that in the peripheral portion of the substrate are different from each other.

8. The plasma doping method of claim 6, wherein:
the plasma doping condition during the initial period of doping is set so that a distribution of a flow rate of the gas is such that the flow rate is greater on the central portion of the substrate than on the peripheral portion of the substrate; and
the changed plasma doping condition is set so that the distribution of the flow rate of the gas is such that the flow rate is smaller on the central portion of the substrate than on the peripheral portion of the substrate.

9. The plasma doping method of claim 6, wherein:
the plasma doping condition during the initial period of doping is set so that a distribution of a concentration of the gas is such that the concentration is greater on the central portion of the substrate than on the peripheral portion of the substrate; and
the changed plasma doping condition is set so that the distribution of the concentration of the gas is such that the concentration is smaller on the central portion of the substrate than on the peripheral portion of the substrate.

10. The plasma doping method of claim 6, wherein:
the plasma doping condition during the initial period of doping is set so that a distribution of a source power for generating the plasma is such that the source power is smaller on the central portion of the substrate than on the peripheral portion of the substrate; and
the changed plasma doping condition is set so that the source power distribution is such that the source power is greater on the central portion of the substrate than on the peripheral portion of the substrate.

11. The plasma doping method of claim 6, wherein:
the plasma doping condition during the initial period of doping is set so that a temperature distribution across the substrate is such that the temperature is lower in the peripheral portion of the substrate and higher in the central portion of the substrate; and
the changed plasma doping condition is set so that the temperature distribution across the substrate is such that the temperature is higher in the peripheral portion of the substrate and lower in the central portion of the substrate.

12. The plasma doping method of claim 1, wherein:
a film containing the impurity is already formed on an inner wall of the vacuum chamber before the substrate is plasma-doped with the impurity; and
the plasma doping condition is set so that a distribution of a flow rate of the gas is such that the flow rate on the peripheral portion of the substrate is equal to that on the central portion of the substrate.

13. The plasma doping method of claim 1, wherein:
a film containing the impurity is already formed on an inner wall of the vacuum chamber before the substrate is plasma-doped with the impurity; and
the plasma doping condition is set so that the distribution of the concentration of the gas is such that the concentration on the peripheral portion of the substrate is equal to that on the central portion of the substrate.

14. The plasma doping method of claim 1, wherein:
a film containing the impurity is already formed on an inner wall of the vacuum chamber before the substrate is plasma-doped with the impurity; and
the plasma doping condition is set so that a distribution of a source power for generating the plasma is such that the source power on the peripheral portion of the substrate is equal to that on the central portion of the substrate.

15. The plasma doping method of claim 1, wherein:
a film containing the impurity is already formed on an inner wall of the vacuum chamber before the substrate is plasma-doped with the impurity; and
the plasma doping condition is set so that a temperature distribution across the substrate is such that the temperature in the peripheral portion of the substrate is equal to that in the central portion of the substrate.

16. The plasma doping method of claim 1, wherein the plasma doping condition is changed after the second one of the doses in the central portion and in the peripheral portion of the substrate becomes greater than the first dose under the set plasma doping condition.

17. The plasma doping method of claim 1, wherein the plasma doping condition is changed a plurality of times while the substrate is plasma-doped with the impurity.

18. The plasma doping method of claim 1, wherein the gas contains molecules $B_mH_n$ (where m and n are natural numbers) composed of boron atoms and hydrogen atoms.

19. The plasma doping method of claim 1, wherein the gas is a mixed gas of $B_2H_6$ and He.

20. The plasma doping method of claim 19, wherein a concentration of $B_2H_6$ in the mixed gas is greater than or equal to 0.01% by mass and less than or equal to 1% by mass.

21. The plasma doping method of claim 1, wherein the gas contains $BF_3$, $AsH_4$ or $PH_3$.

22. The plasma doping method of claim 1, wherein the substrate is a silicon substrate.

* * * * *